(12) United States Patent
Kim et al.

(10) Patent No.: US 11,664,437 B2
(45) Date of Patent: May 30, 2023

(54) SEMICONDUCTOR DEVICES

(71) Applicant: Samsung Electronics Co., Ltd., Suwon-si (KR)

(72) Inventors: Ju Youn Kim, Suwon-si (KR); Se Ki Hong, Hwaseong-si (KR)

(73) Assignee: Samsung Electronics Co., Ltd.

( * ) Notice: Subject to any disclaimer, the term of this patent is extended or adjusted under 35 U.S.C. 154(b) by 130 days.

(21) Appl. No.: 17/208,186

(22) Filed: Mar. 22, 2021

(65) Prior Publication Data

US 2021/0210619 A1 Jul. 8, 2021

Related U.S. Application Data

(63) Continuation of application No. 16/050,652, filed on Jul. 31, 2018, now Pat. No. 10,978,570.

(30) Foreign Application Priority Data

Jan. 11, 2018 (KR) ........................ 10-2018-0003649

(51) Int. Cl.
| | | |
|---|---|---|
| *H01L 27/092* | (2006.01) | |
| *H01L 29/49* | (2006.01) | |
| *H01L 29/66* | (2006.01) | |
| *H01L 21/28* | (2006.01) | |

(52) U.S. Cl.
CPC .. *H01L 29/66484* (2013.01); *H01L 21/28079* (2013.01); *H01L 29/4958* (2013.01); *H01L 29/4966* (2013.01); *H01L 29/6656* (2013.01); *H10B 10/12* (2023.02); *H10B 10/18* (2023.02); *H10B 12/09* (2023.02)

(58) Field of Classification Search
None
See application file for complete search history.

(56) References Cited

U.S. PATENT DOCUMENTS

| | | |
|---|---|---|
| 6,261,894 B1 | 7/2001 | Mandelman |
| 6,921,711 B2 | 7/2005 | Cabral |
| 7,531,398 B2 | 5/2009 | Zhang |
| 8,088,685 B2 | 1/2012 | Lin |
| 8,354,309 B2 | 1/2013 | Greene |
| (Continued) | | |

FOREIGN PATENT DOCUMENTS

| | | |
|---|---|---|
| KR | 20150077545 A | 7/2015 |
| KR | 20160095399 A | 8/2016 |

*Primary Examiner* — Joseph C. Nicely
*Assistant Examiner* — Lamont B Koo
(74) *Attorney, Agent, or Firm* — Myers Bigel, P.A.

(57) ABSTRACT

A semiconductor device includes a substrate with first and second areas, a first trench in the first area, and first and second PMOS transistors in the first area and the second area, respectively. The first transistor includes a first gate insulating layer, a first TiN layer on and contacting the first gate insulating layer, and a first gate electrode on and contacting the first TiN layer. The second transistor includes a second gate insulating layer, a second TiN layer on and contacting the second gate insulating layer, and a first TiAlC layer on and contacting the second TiN layer. The first gate insulating layer, the first TiN layer, and the first gate electrode are within the first trench. The first gate electrode does not include aluminum. A threshold voltage of the first transistor is smaller than a threshold voltage of the second transistor.

20 Claims, 22 Drawing Sheets

(56) References Cited

U.S. PATENT DOCUMENTS

| | | |
|---|---|---|
| 8,536,656 B2 | 9/2013 | Ramachandran |
| 9,105,497 B2 | 8/2015 | Hong |
| 9,177,865 B2 | 11/2015 | Kim |
| 9,219,155 B2 | 12/2015 | Steigerwald |
| 9,269,766 B2 | 2/2016 | Chou |
| 9,508,816 B2 | 11/2016 | Ok |
| 9,553,092 B2 | 1/2017 | Bao |
| 2016/0163603 A1* | 6/2016 | Bao .................. H01L 21/28088 257/412 |
| 2016/0225868 A1 | 8/2016 | Kim et al. |
| 2016/0268259 A1 | 9/2016 | Chang et al. |
| 2017/0229461 A1 | 8/2017 | Liao et al. |

* cited by examiner

SEMICONDUCTOR DEVICES

CROSS-REFERENCE TO RELATED APPLICATION

This application is a continuation application of, and claims priority from, U.S. application Ser. No. 16/050,652, filed on Jul. 31, 2018, which claims priority under 35 U.S.C. § 119 to Korean Patent Application No. 10-2018-0003649, filed on Jan. 11, 2018, in the Korean Intellectual Property Office, the entire contents of each of which are incorporated herein by reference.

BACKGROUND

1. Field

The present inventive concepts relate to semiconductor devices, and, more specifically, to semiconductor devices including transistors.

2. Description of the Related Art

Semiconductor devices are useful in the electronics industry because of their small size, multi-functionality, and/or low fabrication cost. Semiconductor devices may be categorized, for example, as a semiconductor memory device for storing logic data, a semiconductor logic device for processing operations of logic data, and/or a hybrid semiconductor device having both memory and logic elements. Semiconductor devices have been increasingly used for high integration within the electronics industry. For example, semiconductor devices have been increasingly utilized for their high reliability, high speed, and/or multi-functionality. Semiconductor devices have become more complex and integrated to meet these beneficial characteristics.

A semiconductor device may include transistors having different threshold voltages. Examples of transistors having different threshold voltages include a combination of a logic transistor and a static random access memory (SRAM) transistor and/or a dynamic random access memory (DRAM) transistor.

Various methods of controlling the threshold voltages of transistors included in a semiconductor device are being studied.

SUMMARY

Aspects of the inventive concepts provide semiconductor device including a plurality of transistors having different threshold voltages.

However, aspects of the inventive concepts are not restricted to those set forth herein. The above and other aspects of the inventive concept will become more apparent to one of ordinary skill in the art to which the inventive concepts pertain by referencing the detailed description of the inventive concepts given below.

According to some embodiments of the inventive concepts, there is provided a semiconductor device includes a substrate which comprises a first area, a second area, and a third area, a first trench, a second trench, and a third trench in the first area, the second area, and the third area, respectively, and a first transistor, a second transistor, and a third transistor in the first area, the second area, and third area, respectively. The first transistor, the second transistor, and the third transistor are p-channel metal oxide semiconductor (PMOS) devices. The first transistor comprises a first gate insulating layer that is on the substrate, a first TiN layer that is on the first gate insulating layer and contacting the first gate insulating layer, and a first gate electrode that is on the first TiN layer and contacting the first TiN layer, the second transistor comprises a second gate insulating layer that is on the substrate, a second TiN layer that is on the second gate insulating layer and contacting the second gate insulating layer, and a second gate electrode that is on the second TiN layer and contacting the second TiN layer, and the third transistor comprises a third gate insulating layer that is on the substrate, a third lower TiN layer that is on the third gate insulating layer, a third gate electrode that is on the third lower TiN layer, and a third upper TiN layer that is on the third gate electrode. The first gate insulating layer, the first TiN layer and the first gate electrode are within the first trench, the second gate insulating layer, the second TiN layer and the second gate electrode are within the second trench, and the third gate insulating layer, the third lower TiN layer, the third gate electrode and the third upper TiN layer are within the third trench. A second threshold voltage of the second transistor is smaller than a third threshold voltage of the third transistor and greater than a first threshold voltage of the first transistor, and a thickness of the first TiN layer is smaller than that of the second TiN layer.

According to some embodiments of the inventive concepts, there is provided a semiconductor device comprising, a substrate which comprises a first area, a second area, and a third area, a first trench, a second trench, and a third trench in the first area, the second area, and the third area, respectively, and a first transistor, a second transistor, and a third transistor that are respectively in the first area, the second area, and the third area. The first transistor, the second transistor, and the third transistor are p-channel metal oxide semiconductor (PMOS) devices. The first transistor comprises a first gate insulating layer that is on the substrate, a first TiN layer that is on the first gate insulating layer and contacting the first gate insulating layer, and a first gate electrode that is on the first TiN layer and contacting the first TiN layer, the second transistor comprises a second gate insulating layer that is on the substrate, a second TiN layer that is on the second gate insulating layer and contacting the second gate insulating layer, and a second gate electrode that is on the second TiN layer and contacting the second TiN layer, and the third transistor comprises a third gate insulating layer that is on the substrate, a third lower TiN layer that is on the third gate insulating layer, a third gate electrode that is on the third lower TiN layer, and a third upper TiN layer that is on the third gate electrode. The first gate insulating layer, the first TiN layer, and the first gate electrode are within the first trench, the second gate insulating layer, the second TiN layer, and the second gate electrode are within the second trench, and the third gate insulating layer, the third lower TiN layer, the third gate electrode, and the third upper TiN layer are within the third trench. A second threshold voltage of the second transistor is smaller than a third threshold voltage of the third transistor and greater than a first threshold voltage of the first transistor, and the third upper TiN layer and the first TiN layer comprise a same first material.

According to some embodiments of the inventive concepts, there is provided a semiconductor device comprising a substrate which comprises a first area and a second area, a first trench which is formed in the first area, a first transistor and a second transistor that are in the first area and the second area, respectively. The first transistor and the second transistor are p-channel metal oxide semiconductor (PMOS) devices. The first transistor comprises a first gate insulating layer that is on the substrate, a first TiN layer that is on the first gate insulating layer and contacting the first gate insulating layer, and a first gate electrode that is on the first TiN layer and contacting the first TiN layer, and the second transistor comprises a second gate insulating layer that is on the substrate, a second TiN layer that is on the second gate insulating layer and contacting the second gate insulating layer, and a first TiAlC layer that is on the second TiN layer and contacting the second TiN layer. The first gate insulating layer, the first TiN layer, and the first gate electrode are within the first trench, the first gate electrode does not comprise aluminum, and a first threshold voltage of the first transistor is smaller than a second threshold voltage of the second transistor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
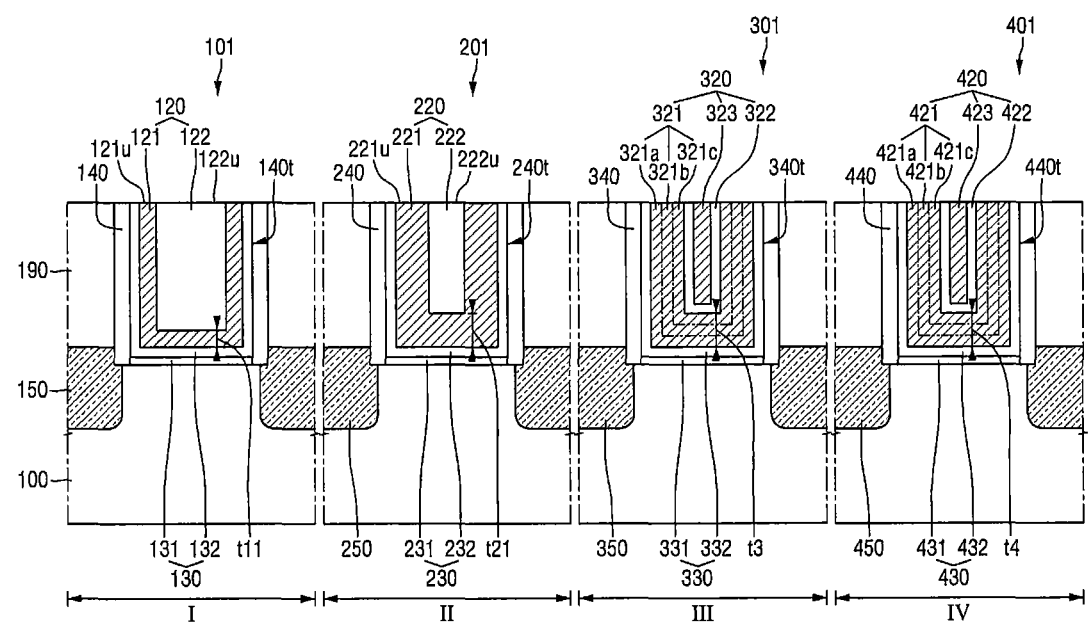
FIGS. 1A through 4 respectively illustrate semiconductor devices according to embodiments of the inventive concepts.

FIG. 1A illustrates a semiconductor device according to embodiments of the inventive concepts. Referring to FIG. 1A, the semiconductor device according to some embodiments of the inventive concepts may include a first transistor 101, a second transistor 201, a third transistor 301, and a fourth transistor 401 (referred to herein as first through fourth transistors 101 through 401) formed on a substrate 100.

The substrate 100 may include a first area I, a second area II, a third area III, and a fourth area IV (referred to herein as first through fourth areas I through IV). The first through fourth areas I through IV may be separated from each other or may be connected to each other. The first through fourth areas I through IV may be included in a portion performing the same function, that is, in a logic area or an input/output (I/O) area. In some embodiments, one or more of the first through fourth areas I through IV may be included in one of portions performing different functions, that is, for example, one of a logic area, a static random access memory (SRAM) area, and an I/O area. In the semiconductor device according to the embodiments described with reference to FIG. 1, each of the first through fourth areas I through IV may be an area in which a p-channel metal oxide semiconductor (PMOS) is formed.

The substrate 100 may be a bulk silicon substrate or a silicon-on-insulator (SOI) substrate. Otherwise, the substrate 100 may be, but is not limited to, a silicon substrate or a substrate made of another material such as, for example, silicon germanium, silicon germanium-on-insulator (SGOI), indium antimonide, lead telluride, indium arsenide, indium phosphide, gallium arsenide and/or gallium antimonide. In the following description, it is assumed, for ease of description, that the substrate 100 is a substrate containing silicon.

The first through fourth transistors 101 through 401 may be formed in the first through fourth areas I through IV, respectively. Since each of the first through fourth areas I through IV is an area in which a PMOS device is formed, each of the first through fourth transistors 101 through 401 may be a p-type transistor.

The first through fourth transistors 101 through 401 may include a first gate insulating layer 130, a second gate insulating layer 230, a third gate insulating layer 330, and a fourth gate insulating layer 430 (referred to herein as first through fourth gate insulating layers 130 through 430), a first gate electrode structure 120, a second gate electrode structure 220, a third gate electrode structure 320, and a fourth gate electrode structure 420 (referred to herein as first through fourth gate electrode structures 120 through 420), first gate spacers 140, second gate spacers 240, third gate spacers 340, and fourth gate spacers 440, (referred to herein as first through fourth gate spacers 140 through 440), and first source/drain regions 150, second source/drain regions 250, third source/drain regions 350, and fourth source/drain regions 450 (referred to herein as first through fourth source/drain regions 150 through 450), respectively. The elements included in each of the first through fourth transistors 101 through 401 will be described below.

An interlayer insulating film 190 may be formed on the substrate 100 of the first through fourth areas I through IV. The interlayer insulating film 190 may include a first trench 140t, a second trench 240t, a third trench 340t, and a fourth trench 440t (referred to herein as first through fourth trenches 140t through 440t).

The first through fourth trenches 140t through 440t may correspond to the first through fourth areas I through IV, respectively. That is, the first trench 140t may be formed on the substrate 100 of the first area I, the second trench 240t may be formed on the substrate 100 of the second area II, the third trench 340t may be formed on the substrate 100 of the third area III, and the fourth trench 440t may be formed on the substrate 100 of the fourth area IV.

The interlayer insulating film 190 may include at least one of, for example, silicon oxide, silicon nitride, silicon oxynitride, and a low dielectric constant (low-k) material.

The first gate spacers 140 may be formed on the substrate 100 of the first area I. The first gate spacers 140 may define the first trench 140t. The first trench 140t may have, for example, the first gate spacers 140 as its sidewalls and an upper surface of the substrate 100 as its bottom surface. The second gate spacers 240 defining the second trench 240t may be formed on the substrate 100 of the second area II. The third gate spacers 340 defining the third trench 340t may be formed on the substrate 100 of the third area III. The fourth gate spacers 440 defining the fourth trench 440t may be formed on the substrate 100 of the fourth area IV.

Each of the first through fourth gate spacers 140 through 440 may include at least one of, e.g., silicon nitride (SiN), silicon oxynitride (SiON), silicon oxide (SiO$_2$), silicon oxycarbonitride (SiOCN), and combinations of the same. Although each of the first through fourth gate spacers 140 through 440 is illustrated as being a single layer, this is merely an example used for ease of description, and each of the first through fourth gate spacers 140 through 440 is not necessarily a single layer. When one or more of the first through fourth gate spacers 140 through 440 includes a plurality of layers, at least one of the layers may contain a low-k material. In some embodiments, the at least one layer may be L-shaped. In some embodiments, each of the first through fourth gate spacers 140 through 440 may serve as a guide for forming a self-aligned contact. Accordingly, each of the first through fourth gate spacers 140 through 440 may include a material having an etch selectivity with respect to the interlayer insulating film 190.

The first through fourth gate insulating layers 130 through 430 may be formed on the substrate 100 of the first through fourth areas I through IV, respectively. The first through fourth gate insulating layers 130 through 430 may extend along sidewalls and bottom surfaces of the first through fourth trenches 140t through 440t, respectively.

The first through fourth gate insulating layers 130 through 430 may include a first interfacial layer 131, a second interfacial layer 231, a third interfacial layer 331, and a fourth interfacial layer 431 (referred to herein as first through fourth interfacial layers 131 through 431), respectively, and a first high dielectric constant (high-k) insulating layer 132, a second high-k insulating layer 232, a third high-k insulating layer 332, and a fourth high-k insulating layer 432, (referred to herein as first through fourth high-k insulating layers 132 through 432), respectively. Each of the first through fourth interfacial layers 131 through 431 may be formed on the substrate 100. The first through fourth interfacial layers 131 through 431 may be formed on the bottom surfaces of the first through fourth trenches 140t through 440t, respectively. The first through fourth high-k insulating layers 132 through 432 may be formed on the first through fourth interfacial layers 131 through 431 along the bottom surfaces and sidewalls of the first through fourth trenches 140t through 440t, respectively.

Although the first through fourth interfacial layers 131 through 431 are illustrated as not being formed on the sidewalls of the first through fourth trenches 140t through 440t, embodiments are not limited to this case. For example, the first through fourth interfacial layers 131 through 431 may also be formed on the sidewalls of the first through fourth trenches 140t through 440t.

Each of the first through fourth interfacial layers 131 through 431 may include, but is not limited to, silicon oxide. That is, each of the first through fourth interfacial layers 131 through 431 may include a different material depending on the type of the substrate 100 or the type of the first, second, third and/or fourth high-k insulating layer 132, 232, 332 or 432.

The first through fourth high-k insulating layers 132 through 432 may include a material having a dielectric constant higher than that of, e.g., silicon.

In some embodiments, each of the first through third gate insulating layers 130 through 330 may not include a lanthanum-based material. For example, each of the first through third gate insulating layers 130 through 330 may not include lanthanum oxide. In some embodiments, the fourth gate insulating layer 430 may include a lanthanum-based material. For example, the fourth gate insulating layer 430 may include lanthanum oxide.

The first through fourth gate electrode structures 120 through 420 may be formed on the first through fourth gate insulating layers 130 through 430, respectively. The first through fourth gate electrode structures 120 through 420 may be within and, in some embodiments, fill the first through fourth trenches 140t through 440t, respectively. The first and second gate electrode structures 120 and 220 may include first and second TiN layers 121 and 221 and first and second gate electrodes 122 and 222, respectively.

The first and second TiN layers 121 and 221 may be formed on the first and second gate insulating layers 130 and 230, respectively. The first and second TiN layers 121 and 221 may contact the first and second gate insulating layers 130 and 230, respectively. The first and second TiN layers 121 and 221 may extend along the sidewalls and bottom surfaces of the first and second trenches 140t and 240t, respectively.

The first and second gate electrodes 122 and 222 may be formed on the first and second TiN layers 121 and 221, respectively. For example, the first and second gate electrodes 122 and 222 may contact the first and second TiN layers 121 and 221, respectively. The first and second gate electrodes 122 and 222 may respectively be within, and, in some embodiments, fill the remaining spaces of the first and second trenches 140t and 240t in which the first and second TiN layers 121 and 221 are disposed. In other words, in some embodiments, the first gate insulating layer 130, the first TiN layer 121, and the first gate electrode 122 may fill the first trench 140t, and the second gate insulating layer 230, the second TiN layer 221, and the second gate electrode 222 may fill the second trench 240t.

Respective upper surfaces 121U and 221U of the first and second TiN layers 121 and 221 may lie in the same plane with respective upper surfaces 122U and 222U of the first and second gate electrodes 122 and 222, respectively. In some embodiments, the upper surfaces may be the uppermost surfaces.

The third and fourth gate electrode structures 320 and 420 may include third and fourth lower TiN layers 321 and 421, third and fourth gate electrodes 322 and 422, and third and fourth upper TiN layers 323 and 423, respectively.

The third and fourth lower TiN layers 321 and 421 may be formed on the third and fourth gate insulating layers 330 and 430, respectively. The third and fourth lower TiN layers 321 and 421 may contact the third and fourth gate insulating layers 330 and 430, respectively. The third and fourth lower TiN layers 321 and 421 may extend along the sidewalls and bottom surfaces of the third and fourth trenches 340t and 440t, respectively.

The third and fourth gate electrodes 322 and 422 may extend along the sidewalls and bottom surfaces of the third and fourth trenches 340t and 440t, respectively. The third and fourth gate electrodes 322 and 422 may be formed on the third and fourth lower TiN layers 321 and 421 along the profiles of the third and fourth lower TiN layers 321 and 421, respectively. For example, the third and fourth gate electrodes 322 and 422 may contact the third and fourth lower TiN layers 321 and 421, respectively.

The third and fourth upper TiN layers 323 and 423 may be formed on the third and fourth gate electrodes 322 and 422, respectively. For example, the third and fourth upper TiN layers 323 and 423 may contact the third and fourth gate electrodes 322 and 422, respectively. The third and fourth upper TiN layers 323 and 423 may respectively be within and, in some embodiments, fill the remaining spaces of the third and fourth trenches 340t and 440t in which the third and fourth lower TiN layers 321 and 421 and the third and fourth gate electrodes 322 and 422 are formed. In other words, in some embodiments, the third gate insulating layer 330, the third lower TiN layer 321, the third gate electrode 322, and the third upper TiN layer 323 may fill the third trench 340t, and the fourth gate insulating layer 430, the fourth lower TiN layer 421, the fourth gate electrode 422, and the fourth upper TiN layer 423 may fill the fourth trench 440t.

The third lower TiN layer 321 may include a first portion 321a, a second portion 321b, and a third portion 321c. The first portion 321a of the third lower TiN layer 321 may be disposed on the third gate insulating layer 330 along the profile of the third gate insulating layer 330. The first portion 321a of the third lower TiN layer 321 may contact the third gate insulating layer 330. The second portion 321b of the third lower TiN layer 321 may be disposed on the first portion 321a along the profile of the first portion 321a. The third portion 321c of the third lower TiN layer 321 may be disposed on the second portion 321b along the profile of the second portion 321b.

The fourth lower TiN layer 421 may include a fourth portion 421a, a fifth portion 421b, and a sixth portion 421c. The fourth portion 421a of the fourth lower TiN layer 421 may be disposed on the fourth gate insulating layer 430 along the profile of the fourth gate insulating layer 430. The fourth portion 421a of the fourth lower TiN layer 421 may contact the fourth gate insulating layer 430. The fifth portion 421b of the fourth lower TiN layer 421 may be disposed on the fourth portion 421a along the profile of the fourth portion 421a. The sixth portion 421c of the fourth lower TiN layer 421 may be disposed on the fifth portion 421b along the profile of the fifth portion 421b.

The first TiN layer 121, the second TiN layer 221, the third lower TiN layer 321, the third upper TiN layer 323, the fourth lower TiN layer 421, and the fourth upper TiN layer 423 may include TiN. In some embodiments, the first TiN layer 121, the second TiN layer 221, the third lower TiN layer 321, the third upper TiN layer 323, the fourth lower TiN layer 421, and the fourth upper TiN layer 423 may not include TaN.

In some embodiments, the oxygen contents of the first portion 321a and the fourth portion 421a may be greater than those of the second portion 321b, the third portion 321c, the fifth portion 421b, the sixth portion 421c, the third upper TiN layer 323, and the fourth upper TiN layer 423. The first portion 321a and the fourth portion 421a may be formed before the second portion 321b and the fifth portion 421b are formed, respectively. For example, after the third and fourth gate insulating layers 330 and 430 are formed in the third and fourth trenches 340t and 440t, respectively, TiN layers may be formed on the third and fourth gate insulating layers 330 and 430 along the profiles of the third and fourth gate insulating layers 330 and 430, respectively. On the TiN layers, polysilicon layers may be formed along the profiles of the TiN layers. Then, the polysilicon layers may be annealed. After the annealing process, the polysilicon layers may be removed. Here, the TiN layers after the annealing process may be the first portion 321a and the fourth portion 421a. Next, TiN layers may be formed on the first portion 321a and the fourth portion 421a along the profiles of the first portion 321a and the fourth portion 421a, respectively.

The TiN layers formed on the first portion 321a and the fourth portion 421a may be the second portion 321b and the fifth portion 421b, respectively. Here, since the first portion 321a and the fourth portion 421a have undergone the annealing process performed on the polysilicon layers, they may have higher oxygen content than the second portion 321b, the third portion 321c, the fifth portion 421b, the sixth portion 421c, the third upper TiN layer 323, and the fourth upper TiN layer 423.

Although an embodiment in which the first portion 321a and the fourth portion 421a are formed simultaneously has been described, embodiments of the inventive concepts are not limited thereto. For example, the first portion 321a and the fourth portion 421a may be formed separately. Respective thicknesses of the first portion 321a and the fourth portion 421a may be the same or different.

The first and second gate electrodes 122 and 222 may include the same material. The third and fourth gate electrodes 322 and 422 may include the same material. In some embodiments, the material included in the first and second gate electrodes 122 and 222 may be different from the material included in the third and fourth gate electrodes 322 and 422. The first and second gate electrodes 122 and 222 may include at least one of, e.g., W, Al, Co, Cu, Ru, Ni, Pt, Ni—Pt, and TiN. In some embodiments, the first and second gate electrodes 122 and 222 may not include an aluminum element. For example, the first and second gate electrodes 122 and 222 may not include TiAlC. The third and fourth gate electrodes 322 and 422 may include one of, e.g., Ti, TiAl, TiAlN, TiAlC, and TiAlCN. In some semiconductor devices according to the embodiments of the inventive concepts, the third and fourth gate electrodes 322 and 422 are described as layers containing TiAlC.

The first through fourth source/drain regions 150 through 450 may be formed adjacent to the first through fourth gate electrode structures 120 through 420. Although each of the first through fourth source/drain regions 150 through 450 is illustrated as including an epitaxial layer formed in the substrate 100, embodiments of the inventive concepts are not limited thereto. Each of the first through fourth source/drain regions 150 through 450 may also be an impurity region formed by implanting impurities into the substrate 100. In some embodiments, each of the first through fourth source/drain regions 150 through 450 may be an elevated source/drain region having an upper surface protruding above the upper surface of the substrate 100.

In some embodiments, a thickness t11 of the first TiN layer 121 may be smaller than a thickness t21 of the second TiN layer 221. A thickness t3 of the third lower TiN layer 321 and a thickness t4 of the fourth lower TiN layer 421 may be substantially equal. However, the thickness t3 of the third lower TiN layer 321 and the thickness t4 of the fourth lower TiN layer 421 can also vary depending on a process of forming the third and fourth lower TiN layers 321 and 421.

A threshold voltage of the second transistor 201 may be greater than a threshold voltage of the first transistor 101 and smaller than a threshold voltage of the third transistor 301. In addition, the threshold voltage of the third transistor 301 may be smaller than a threshold voltage of the fourth transistor 401. Each of the first through fourth transistors 101 through 401 illustrated in FIG. 1A may be a p-type transistors. Accordingly, the fourth transistor 401 having the largest threshold voltage may be, for example, a p-type high voltage transistor. In addition, the third transistor 301 may be a p-type regular voltage transistor, and the second transistor 201 may be a p-type low voltage transistor. Also, the first transistor 101 having the smallest threshold voltage may be a p-type super low voltage transistor.

For example, in an embodiment in which the first and second gate electrodes 122 and 222 of the first and second transistors 101 and 201 do not include an aluminum element, the threshold voltage of the second transistor 201 whose TiN layer (e.g., the second TiN layer 221) is thicker may be greater than the threshold voltage of the first transistor 101. In other words, in the first and second transistors 101 and 201 in which the first and second gate electrodes 122 and 222 do not include an aluminum element, the threshold voltage of each transistor can be adjusted using only the thickness of a TiN layer which contacts a gate insulating layer. In the semiconductor device according to some embodiments of the inventive concepts, the first and second gate electrodes 122 and 222 may not include, e.g., TiAlC. Therefore, each of the first and second transistors 101 and 201 may have a threshold voltage lower than those of super low voltage and low voltage p-type transistors including TiAlC. In some embodiments in which the third and fourth transistors 301 and 401 have the same structure, a lanthanum-based material may be included in the fourth gate insulating layer 430 of the fourth transistor 401 having a higher threshold voltage in order to adjust the threshold voltages.

Figure 1B:
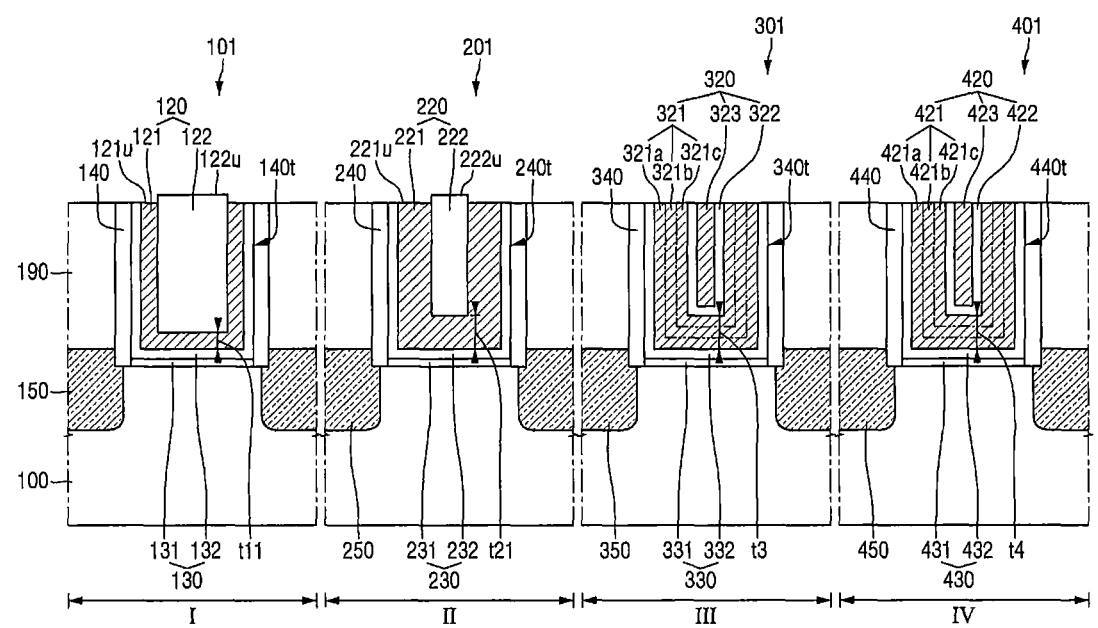

FIG. 1B illustrates a semiconductor device according to embodiments of the inventive concepts. For ease of description, differences from the semiconductor device described above with reference to FIG. 1A will be mainly described. Referring to FIG. 1B, in the semiconductor device according to the embodiments of the inventive concepts, respective upper surfaces 121U and 221U of first and second TiN layers 121 and 221 may be located lower than respective upper surfaces 122U and 222U of first and second gate electrodes 122 and 222, respectively. An uppermost surface of a third lower TiN layer 321, an uppermost surface of a third gate electrode 322, an uppermost surface of a fourth lower TiN layer 421, and an uppermost surface of a fourth gate electrode 422 may lie in the same plane.

Figure 1C:
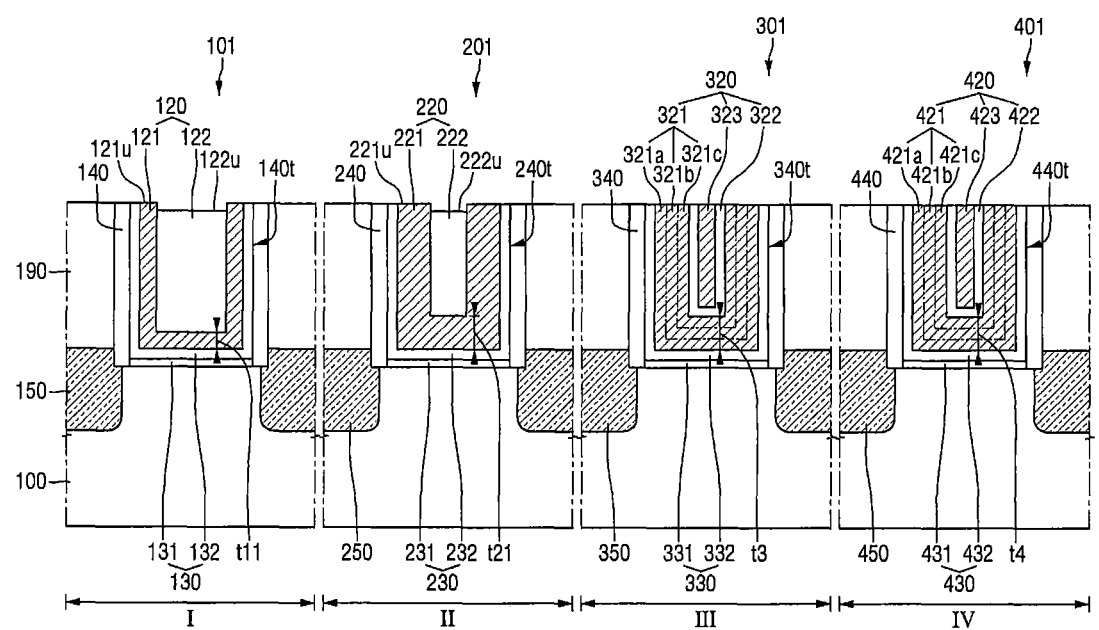

FIG. 1C illustrates a semiconductor device according to embodiments of the inventive concepts. For ease of description, differences from the semiconductor devices described above will be mainly described. Referring to FIG. 1C, in the semiconductor device according to the embodiments of the inventive concepts, respective upper surfaces 121U and 221U of first and second TiN layers 121 and 221 may be located higher than respective upper surfaces 122U and 222U of first and second gate electrodes 122 and 222, respectively.

In FIGS. 1A through 1C, each gate electrode structure may further include a capping pattern. In some embodiments, each gate electrode structure may partially fill a corresponding trench. Each capping pattern may be disposed on a corresponding gate electrode structure to fill a corresponding trench. Each capping pattern may include, for example, at least one of silicon nitride (SiN), silicon oxynitride (SiON), silicon oxide (SiO$_2$), silicon carbonitride (SiCN), silicon oxycarbonitride (SiOCN), and combinations of the same.

Figure 2:
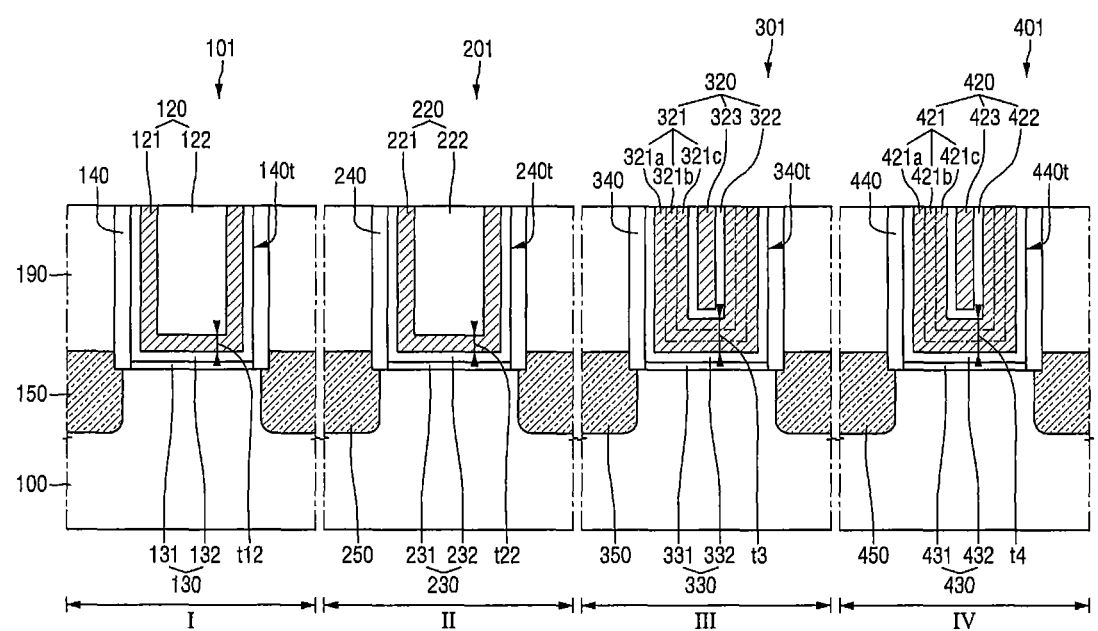

FIG. 2 illustrates a semiconductor device according to embodiments of the inventive concepts. For ease of description, differences from the semiconductor devices described above will be mainly described.

Referring to FIG. 2, a thickness t12 of a first TiN layer 121 may be substantially equal to a thickness t22 of a second TiN layer 221. In this case, a second gate insulating layer 230 may include a lanthanum-based material. When the thicknesses t12 and t22 of the first and second TiN layers 121 and 221 are substantially equal, a threshold voltage of a second transistor 201 in which the second gate insulating layer 230 includes a lanthanum-based material may be higher than that of a first transistor 101 in which a first gate insulating layer 130 does not include a lanthanum-based material. In the semiconductor device according to the embodiments of the inventive concepts, first and second gate electrode structures 120 and 220 may have the same structure, but the first and second gate insulating layers 130 and 230 include different materials in order to adjust the threshold voltages.

Figure 3:
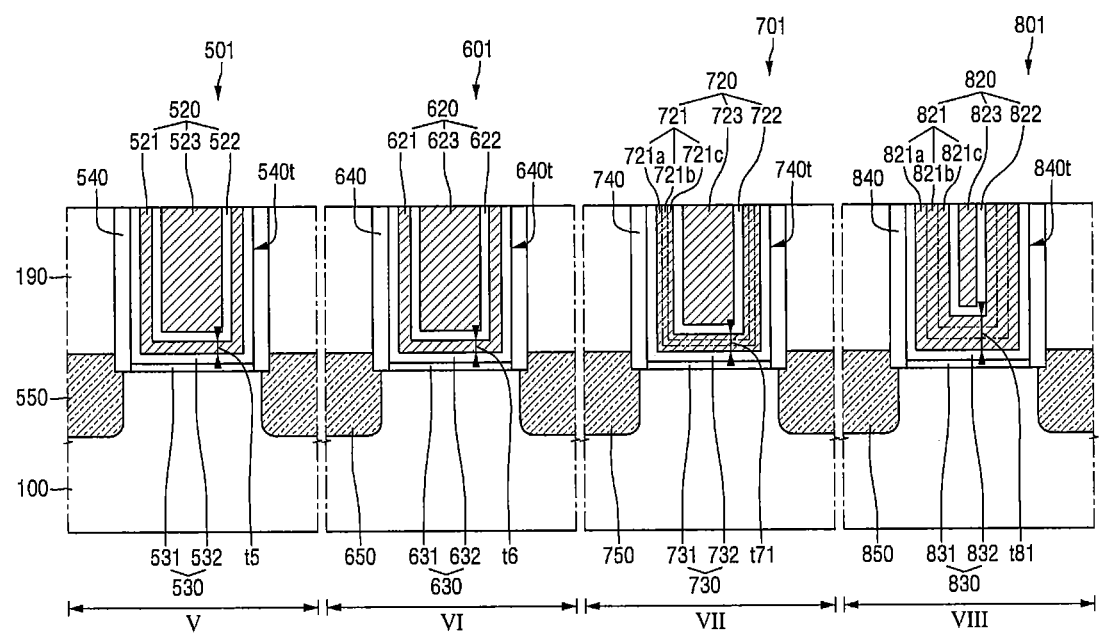

FIG. 3 illustrates a semiconductor device according to embodiments of the inventive concepts. For ease of description, differences from the semiconductor devices described above will be mainly described.

Referring to FIG. 3, the semiconductor device according to the embodiments of the inventive concepts, may include a fifth area V, a sixth area VI, a seventh area VII, and an eighth area VIII (referred to herein as fifth through eighth areas V through VIII). Each of the fifth through eighth areas V through VIII may be an area in which an n-channel metal oxide semiconductor (NMOS) device is formed. That is, each of a fifth transistor 501, a sixth transistor 601, a seventh transistor 701, and an eighth transistor 801 (referred to herein as fifth through eighth transistors 501 through 801) may be an n-type transistor. The fifth through eighth transistors 501 through 801 may include a fifth gate insulating layer 530, a sixth gate insulating layer 630, a seventh gate insulating layer 730, and an eighth gate insulating layer 830 (referred to herein as fifth through eighth gate insulating layers 530 through 830), a fifth gate electrode structure 520, a sixth gate electrode structure 620, a seventh gate electrode structure 720, and an eighth gate electrode structure 820 (referred to herein as fifth through eighth gate electrode structures 520 through 820), fifth gate spacers 540, sixth gate spacers 640, seventh gate spacers 740, and eighth gate spacers 840 (referred to herein as fifth through eighth gate spacers 540 through 840), and fifth source/drain regions 550, sixth source/drain regions 650, seventh source/drain regions 750, and eighth source/drain regions 850 (referred to herein as fifth through eighth source/drain regions 550 through 850), respectively. The elements included in each of the fifth through eighth transistors 501 through 801 will be described below.

The fifth through eighth gate spacers 540 through 840 defining a fifth trench 540*t*, a sixth trench 640*t*, a seventh trench 740*t*, and an eighth trench 840*t* (referred to herein as fifth through eighth trenches 540*t* through 840*t*) may be formed on a substrate 100 of the fifth through eighth areas V through VIII, respectively. The fifth through eighth gate spacers 540 through 840 may include the same materials as the first through fourth gate spacers 140 through 440, respectively. In some embodiments, like the first through fourth gate spacers 140 through 440, at least one of the fifth through eighth gate spacers 540 through 840 may include a plurality of layers.

The fifth through eighth gate insulating layers 530 through 830 may be disposed on the substrate 100 of the fifth through eighth areas V through VIII, respectively. The fifth through eighth gate insulating layers 530 through 830 may extend along sidewalls and bottom surfaces of the fifth through eighth trenches 540*t* through 840*t*, respectively. The fifth through eighth gate insulating layers 530 through 830 may include a fifth interfacial layer 531, a sixth interfacial layer 631, a seventh interfacial layer 731, an eighth interfacial layer 831 (referred to herein as fifth through eighth interfacial layers 531 through 831) and a fifth high-k insulating layer 532, a sixth high-k insulating layer 632, a seventh high-k insulating layer 732, and an eighth high-k insulating layer 832 (referred to herein as fifth through eighth high-k insulating layers 532 through 832), respectively.

Each of the fifth through eighth interfacial layers 531 through 831 may be disposed on the substrate 100. The fifth through eighth interfacial layers 531 through 831 may be disposed on the bottom surfaces of the fifth through eighth trenches 540t through 840t, respectively. The fifth through eighth high-k insulating layers 532 through 832 may be disposed along the bottom surfaces and sidewalls of the fifth through eighth trenches 540t through 840t, respectively. The fifth through eighth interfacial layers 531 through 831 may include the same materials as, e.g., the first through fourth interfacial layers 131 through 431, respectively. The fifth through eighth high-k insulating layers 532 through 832 may include the same materials as, e.g., the first through fourth high-k insulating layers 132 through 432, respectively.

In some embodiments, the fifth and eighth gate insulating layers 530 and 830 may include a lanthanum-based material, and the sixth and seventh gate insulating layers 630 and 730 may not include a lanthanum-based material.

The fifth and sixth gate electrode structures 520 and 620 may be disposed on the fifth and sixth gate insulating layers 530 and 630, respectively. The fifth and sixth gate electrode structures 520 and 620 may be within and, in some embodiments, fill the fifth and sixth trenches 540t and 640t, respectively. The fifth and sixth gate electrode structures 520 and 620 may include fifth and sixth lower TiN layers 521 and 621, fifth and sixth gate electrodes 522 and 622, and fifth and sixth upper TiN layers 523 and 623, respectively.

The fifth lower TiN layer 521, the sixth lower TiN layer 621, a seventh lower TiN layer 721, and an eighth lower TiN layer 821 (referred to herein as fifth through eighth lower TiN layers 521 through 821) may be disposed on the fifth through eighth gate insulating layers 530 through 830, respectively. The fifth through eighth lower TiN layers 521 through 821 may contact the fifth through eighth gate insulating layers 530 through 830, respectively. The fifth through eighth lower TiN layers 521 through 821 may extend along the sidewalls and bottom surfaces of the fifth through eighth trenches 540t through 840t, respectively.

The seventh lower TiN layer 721 may include a seventh portion 721a, an eighth portion 721b, and a ninth portion 721c. The eighth lower TiN layer 821 may include a tenth portion 821a, an eleventh portion 821b, and a twelfth portion 821c. The seventh and tenth portions 721a and 821a may contact the seventh and eighth gate insulating layers 730 and 830, respectively. The eighth and eleventh portions 721b and 821b may be disposed on the seventh and tenth portions 721a and 821a along the profiles of the seventh and tenth portions 721a and 821a, respectively. The ninth and twelfth portions 721c and 821c may be disposed on the eighth and eleventh portions 721b and 821b along the profiles of the eighth and eleventh portions 721b and 821b, respectively.

The fifth gate electrode 522, the sixth gate electrode 622, a seventh gate electrode 722, and an eighth gate electrode 822 (referred to herein as fifth through eighth gate electrodes 522 through 822) may be disposed on the fifth through eighth lower TiN layers 521 through 821, respectively. For example, the fifth through eighth gate electrodes 522 through 822 may contact the fifth through eighth lower TiN layers 521 through 821, respectively.

The fifth upper TiN layer 523, the sixth upper TiN layer 623, a seventh upper TiN layer 723, and an eighth upper TiN layer 823 (referred to herein as fifth through eighth upper TiN layers 523 through 823) may be disposed on the fifth through eighth gate electrodes 522 through 822, respectively. For example, the fifth through eighth upper TiN layers 523 through 823 may contact the fifth through eighth gate electrodes 522 through 822, respectively. The fifth through eighth upper TiN layers 523 through 823 may respectively be within, and, in some embodiments, fill the remaining spaces of the fifth through eighth trenches 540t through 840t in which the fifth through eighth lower TiN layers 521 through 821 and the fifth through eighth gate electrodes 522 through 822 are disposed.

The fifth lower TiN layer 521, the fifth upper TiN layer 523, the sixth lower TiN layer 621, the sixth upper TiN layer 623, the seventh lower TiN layer 721, the seventh upper TiN layer 723, the eighth lower TiN layer 821, and the eighth upper TiN layer 823 may include TiN. In some embodiments, the fifth lower TiN layer 521, the fifth upper TiN layer 523, the sixth lower TiN layer 621, the sixth upper TiN layer 623, the seventh lower TiN layer 721, the seventh upper TiN layer 723, the eighth lower TiN layer 821 and the eighth upper TiN layer 823 may not include TaN.

In some embodiments, the respective oxygen contents of the seventh and tenth portions 721a and 821a may be greater than those of the eighth portion 721b, the ninth portion 721c, the eleventh portion 821b, the twelfth portion 821c, the fifth lower TiN layer 521, the fifth upper TiN layer 523, the sixth lower TiN layer 621, the sixth upper TiN layer 623, the seventh lower TiN layer 721, the seventh upper TiN layer 723, the eighth lower TiN layer 821, and the eighth upper TiN layer 823.

The fifth through eighth gate electrodes 522 through 822 may include the same material. The fifth through eighth gate electrodes 522 through 822 may include one of, e.g., Ti, TiAl, TiAlN, TiAlC, and TiAlCN. In some semiconductor devices according to the embodiments of the inventive concepts, the fifth through eighth gate electrodes 522 through 822 may be described as layers containing TiAlC.

The fifth through eighth source/drain regions 550 through 850 may be formed adjacent to the fifth through eighth gate electrode structures 520 through 820.

In some embodiments, a thickness t5 of the fifth lower TiN layer 521 may be substantially equal to a thickness t6 of the sixth lower TiN layer 621. A thickness t71 of the seventh lower TiN layer 721 may be smaller than a thickness t81 of the eighth lower TiN layer 821. The thickness t5 of the fifth lower TiN layer 521 and the thickness t6 of the sixth lower TiN layer 621 may be smaller than the thickness t71 of the seventh lower TiN layer 721.

A threshold voltage of the sixth transistor 601 may be greater than a threshold voltage of the fifth transistor 501 and smaller than a threshold voltage of the seventh transistor 701. In addition, the threshold voltage of the seventh transistor 701 may be smaller than a threshold voltage of the eighth transistor 801. Each of the fifth through eighth transistors 501 through 801 may be an n-type transistor. Accordingly, the eighth transistor 801 having the largest threshold voltage may be, for example, an n-type high voltage transistor. In addition, the seventh transistor 701 may be an n-type regular voltage transistor, and the sixth transistor 601 may be an n-type low voltage transistor. Also, the fifth transistor 501 having the smallest threshold voltage may be an n-type super low voltage transistor.

Figure 4:
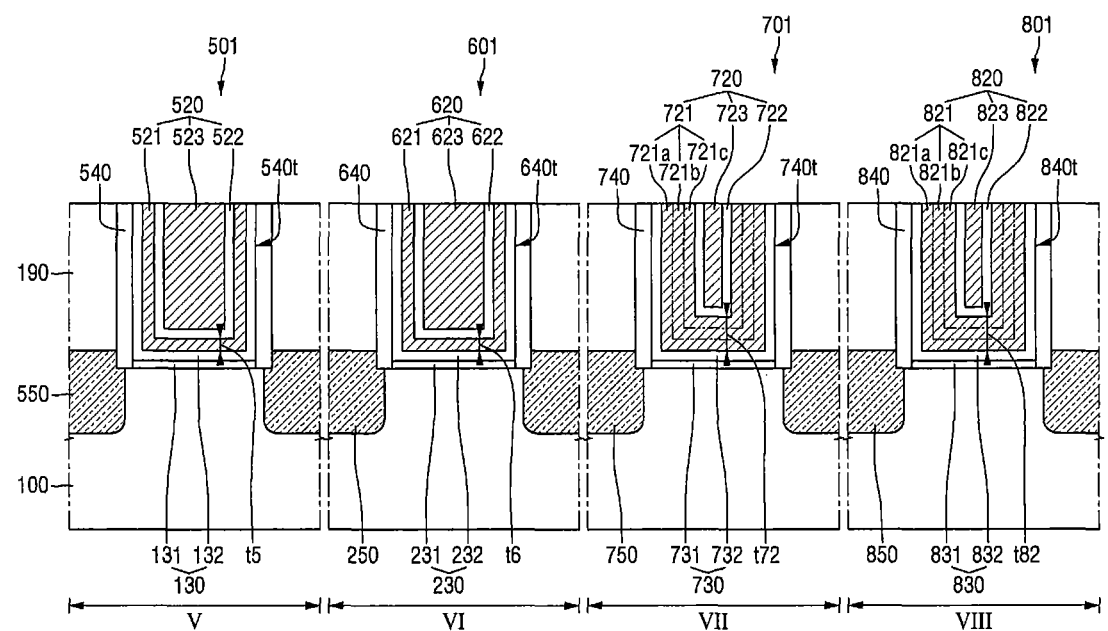

FIG. 4 illustrates a semiconductor device according to embodiments of the inventive concepts. For ease of description, differences from the semiconductor devices described above will be mainly described.

Referring to FIG. 4, a thickness t72 of a seventh lower TiN layer 721 may be substantially equal to a thickness t82 of an eighth lower TiN layer 821. Unlike in FIG. 3, a seventh gate insulating layer 730 may include a lanthanum-based material, and an eighth gate insulating layer 830 may not include a lanthanum-based material. In some embodiments, seventh through twelfth portions 721a, 721b, 721c, 821a, 821b and 821c may all include TiN and may have the same oxygen content.

Figure 5:
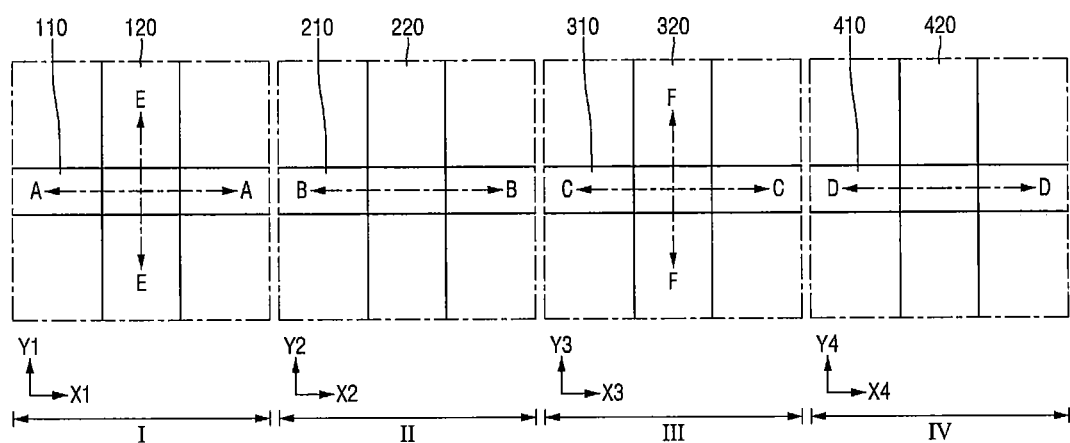
FIG. 5 is a layout view of a semiconductor device according to embodiments of the inventive concepts.
Figure 6:
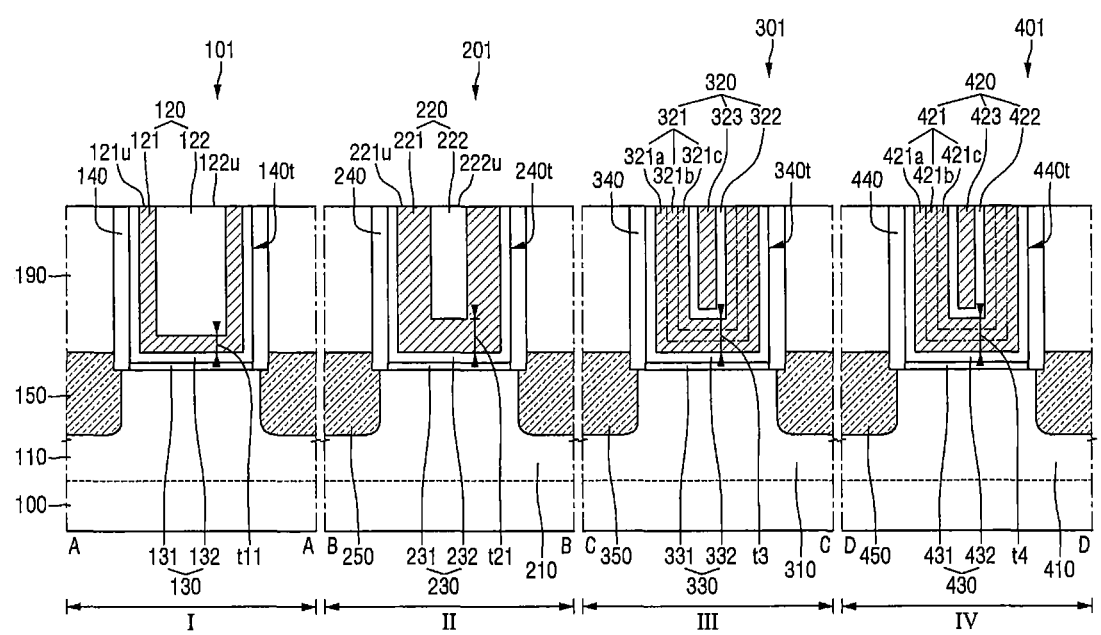
FIG. 6 is a cross-sectional view taken along the lines A-A, B-B, C-C and D-D of FIG. 5.
Figure 7:
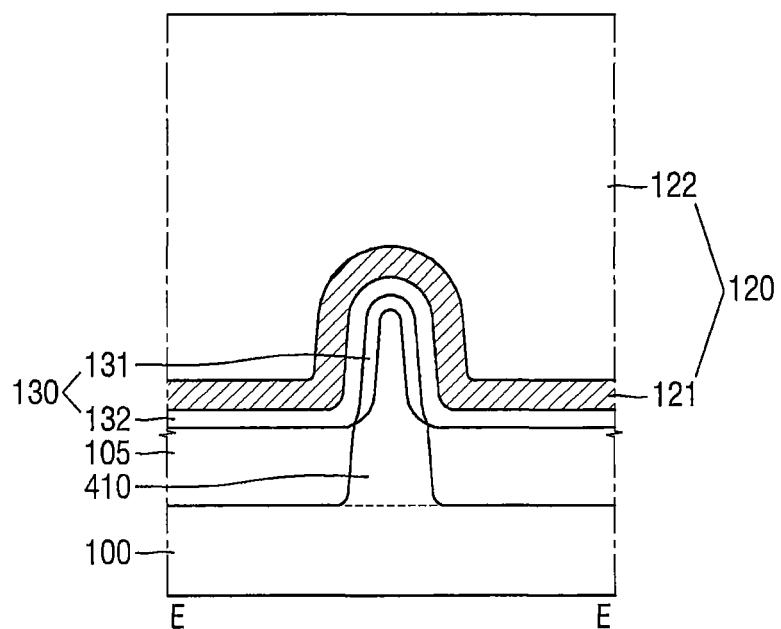
FIG. 7 is a cross-sectional view taken along the line E-E of FIG. 5.
Figure 8:
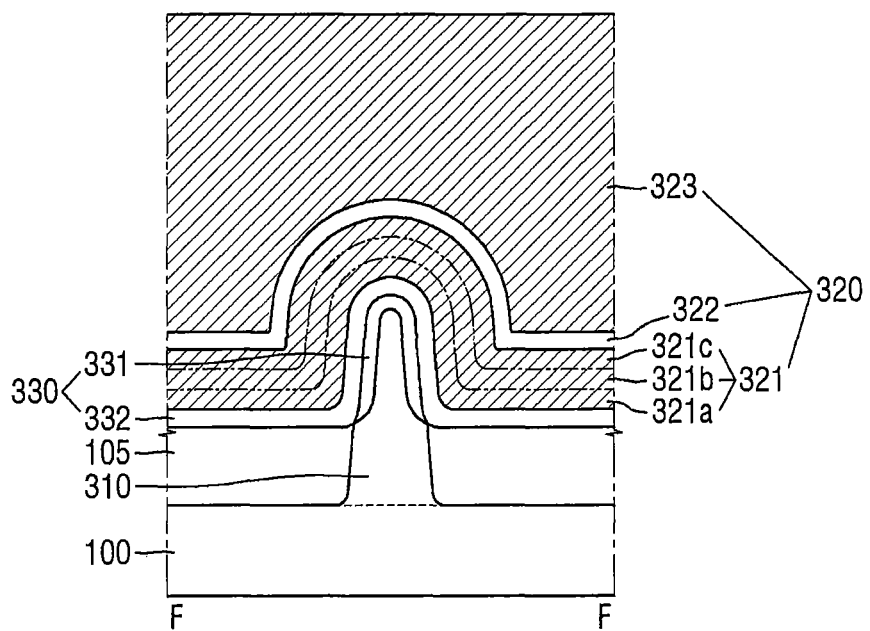
FIG. 8 is a cross-sectional view taken along the line F-F of FIG. 5.

FIG. 5 is a layout view of a semiconductor device according to embodiments. FIG. 6 is a cross-sectional view taken along the lines A-A, B-B, C-C, and D-D of FIG. 5. FIG. 7 is a cross-sectional view taken along the line E-E of FIG. 5. FIG. 8 is a cross-sectional view taken along the line F-F of FIG. 5. For ease of description, differences from the semiconductor device described above with reference to FIG. 1A will be mainly described. For reference, FIG. 6 may be substantially similar to FIG. 1A except for fin patterns. Therefore, a description of elements and features identical to those of FIG. 1A will be given briefly or omitted. In addition, although FIG. 7 shows a cross-sectional view of only a first area I in a gate direction (Y1) and FIG. 8 shows a cross-sectional view of only a third area III in a gate direction (Y3), it will be understood by those of ordinary skill in the art that a cross-sectional view of a second area II in a gate direction (Y2) and a cross-sectional view of a fourth area IV in a gate direction (Y4) may be similar to FIGS. 7 and 8, respectively.

Referring to FIGS. 5 through 7, in the semiconductor device according to the embodiments, each of first through fourth transistors 101 through 401 may be a p-type fin transistor. The first through fourth transistors 101 through 401 may include a first fin pattern 110, a second fin pattern 210, a third fin pattern 310, and a fourth fin pattern 410 (referred to herein as first through fourth fin patterns 110 through 410), respectively. The first through fourth fin patterns 110 through 410 may be formed in the first through fourth areas I through IV, respectively. Each of the first through fourth fin patterns 110 through 410 may protrude from a substrate 100. The first through fourth fin patterns 110 through 410 may extend along first through fourth directions X1 through X4, respectively.

Each of the first through fourth fin patterns 110 through 410 may be a part of the substrate 100 or may include an epitaxial layer grown from the substrate 100. Each of the first through fourth fin patterns 110 through 410 may include an elemental semiconductor material such as silicon and/or germanium. In addition, each of the first through fourth fin patterns 110 through 410 may include a compound semiconductor such as a group IV-IV compound semiconductor or a group III-V compound semiconductor. In some semiconductor devices according to the embodiments of the inventive concepts, each of the first through fourth fin patterns 110 through 410 may be described as a silicon fin pattern.

A field insulating layer 105 may be disposed on the substrate 100 and may cover at least a part of each of the first through fourth fin patterns 110 through 410. For example, since the field insulating layer 105 partially covers side surfaces of each of the first through fourth fin patterns 110 through 410, each of the first through fourth fin patterns 110 through 410 may protrude above the field insulating layer 105 formed on the substrate 100. The field insulating layer 105 may include, for example, an oxide layer, a nitride layer, an oxynitride layer, or a combination of the same.

First through fourth gate spacers 140 through 440 may respectively be disposed on the first through fourth fin patterns 110 through 410 protruding above the field insulating layer 105. The first through fourth gate spacers 140 through 440 may extend along fifth through eighth directions Y1 through Y4, respectively, and intersect the first through fourth fin patterns 110 through 410, respectively.

First through fourth trenches 140t through 440t may extend along the fifth through eighth directions Y1 through Y4, respectively.

First through fourth gate insulating layers 130 through 430 may be disposed on the field insulating layer 105 and the first through fourth fin patterns 110 through 410, respectively. The first through fourth gate insulating layers 130 through 430 may be formed on an upper surface of the field insulating layer 105 and along the profiles of the first through fourth fin patterns 110 through 410, respectively. For example, the first through fourth gate insulating layers 130 through 430 may contact the upper surface of the field insulating layer 105 and the first through fourth fin patterns 110 through 410, respectively.

First through fourth interfacial layers 131 through 431 may be disposed on the first through fourth fin patterns 110 through 410, respectively. The first through fourth interfacial layers 131 through 431 may respectively be formed along the profiles of the first through fourth fin patterns 110 through 410 protruding above the upper surface of the field insulating layer 105. Although the first through fourth interfacial layers 131 through 431 are illustrated as not being disposed on the upper surface of the field insulating layer 105, embodiments of the inventive concepts are not limited thereto. For example, depending on a method of forming the first through fourth interfacial layers 131 through 431, the first through fourth interfacial layers 131 through 431 can also be formed along the upper surface of the field insulating layer 105. First through fourth high-k insulating layers 132 through 432 may respectively be disposed on the first through fourth interfacial layers 131 through 431 and may respectively be formed along the profiles of the first through fourth fin patterns 110 through 410 and the upper surface of the field insulating layer 105.

First through fourth gate electrode structures 120 through 420 may intersect the first through fourth fin patterns 110 through 410, respectively. The first through fourth gate electrode structures 120 through 420 may extend along the fifth through eighth directions Y1 through Y4, respectively.

First through fourth source/drain regions 150 through 450 may be disposed in the first through fourth fin patterns 110 through 410, respectively.

Figure 9:
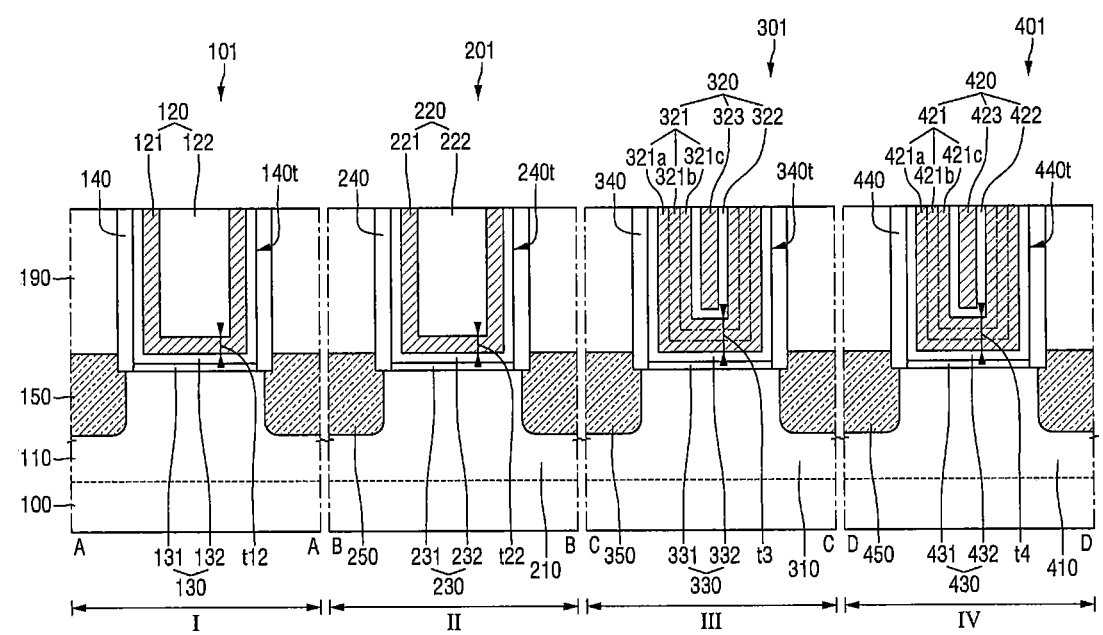
FIG. 9 is a cross-sectional view taken along the lines A-A, B-B, C-C and D-D of FIG. 5.

FIG. 9 is a cross-sectional view taken along the lines A-A, B-B, C-C, and D-D of FIG. 5. For ease of description, differences from the semiconductor devices described above with reference to FIGS. 2 and 6 will be mainly described. For reference, FIG. 9 may be substantially similar to FIG. 2 except for fin patterns. Therefore, a description of elements and features identical to those of FIG. 2 will be given briefly or omitted.

Referring to FIG. 9, in the semiconductor device according to embodiments of the inventive concepts, each of first through fourth transistors 101 through 401 may be a p-type fin transistor. The first through fourth transistors 101 through 401 may include first through fourth fin patterns 110 through 410, respectively. Unlike in FIG. 6, a thickness t12 of a first TiN layer 121 may be substantially equal to a thickness t22 of a second TiN layer 221.

Figure 10:
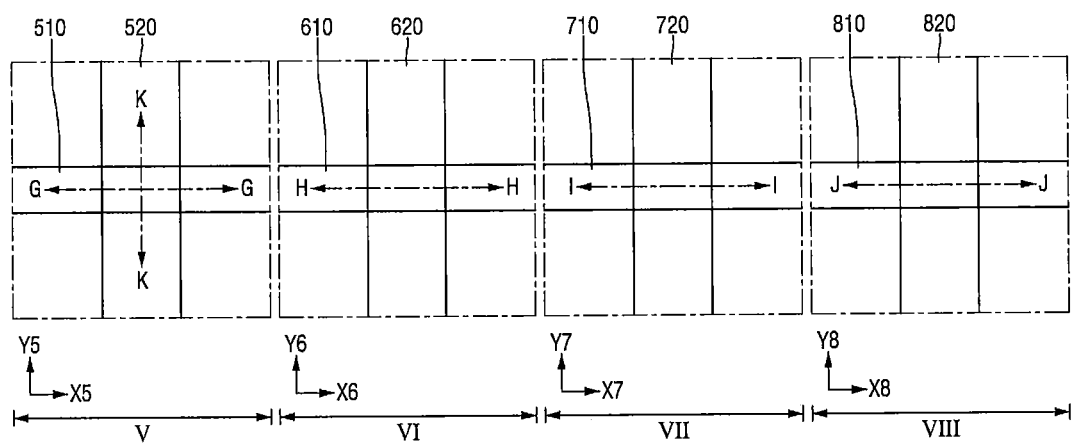
FIG. 10 is a layout view of a semiconductor device according to embodiments of the inventive concepts.
Figure 11:
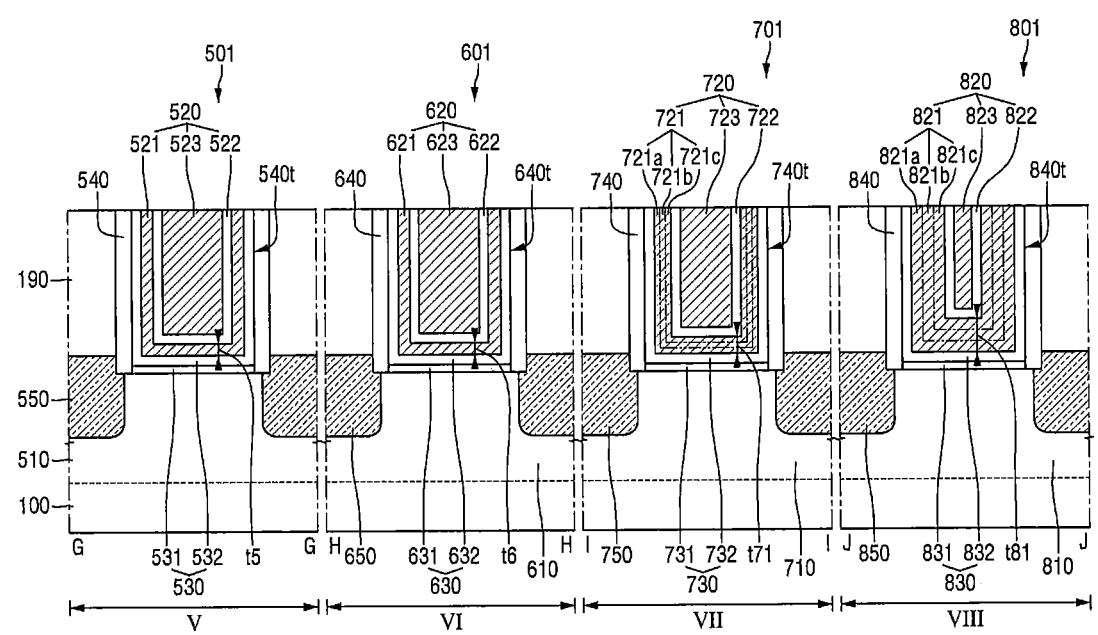
FIG. 11 is a cross-sectional view taken along the lines G-G, H-H, I-I and J-J of FIG. 10.
Figure 12:
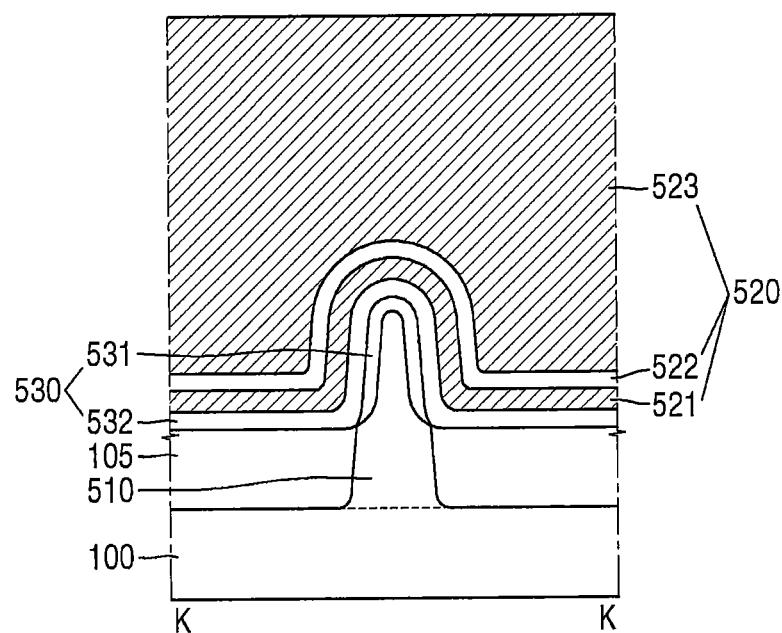
FIG. 12 is a cross-sectional view taken along the line K-K of FIG. 10.

FIG. 10 is a layout view of a semiconductor device according to embodiments of the inventive concepts. FIG. 11 is a cross-sectional view taken along the lines G-G, H-H, I-I and J-J of FIG. 10. FIG. 12 is a cross-sectional view taken along the line K-K of FIG. 10. For ease of description, differences from the semiconductor devices described above with reference to FIG. 3 will be mainly described. For reference, FIG. 11 may be substantially similar to FIG. 3 except for fin patterns. Therefore, a description of elements and features identical to those of FIG. 3 will be given briefly or omitted. In addition, although FIG. 12 shows a cross-sectional view of only a fifth area V in a gate direction (Y5), it will be understood by those of ordinary skill in the art that cross-sectional views of sixth through eighth areas VI through VIII in gate directions (Y6, Y7, and Y8) may be similar to FIG. 12.

Referring to FIGS. 10 through 12, in the semiconductor device according to the embodiments, each of fifth through eighth transistors 501 through 801 may be an n-type fin transistor. The fifth through eighth transistors 501 through 801 may include a fifth fin pattern 510, a sixth fin pattern 610, a seventh fin pattern 710, and an eighth fin pattern 810 (referred to herein as fifth through eighth fin patterns 510 through 810), respectively. The fifth through eighth fin patterns 510 through 810 may be formed in the fifth through eighth areas V through VIII, respectively. Each of the fifth through eighth fin patterns 510 through 810 may protrude from a substrate 100. The fifth through eighth fin patterns 510 through 810 may extend along ninth through twelfth directions X5 through X8, respectively. The fifth through eighth fin patterns 510 through 810 may include the same elements as the first through fourth fin patterns 110 through 410.

A field insulating layer 105 may be disposed on the substrate 100 and may cover at least a part of each of the fifth through eighth fin patterns 510 through 810.

Fifth through eighth gate spacers 540 through 840 may respectively be disposed on the fifth through eighth fin patterns 510 through 810 protruding above the field insulating layer 105. The fifth through eighth gate spacers 540 through 840 may extend along thirteenth through sixteenth directions Y5 through Y8, respectively, and intersect the fifth through eighth fin patterns 510 through 810, respectively.

Fifth through eighth trenches 540t through 840t may extend along the thirteenth through sixteenth directions Y5 through Y8, respectively.

Fifth through eighth gate insulating layers 530 through 830 may be disposed on the field insulating layer 105 and the fifth through eighth fin patterns 510 through 810, respectively. The fifth through eighth gate insulating layers 530 through 830 may be disposed on an upper surface of the field insulating layer 105 and along the profiles of the fifth through eighth fin patterns 510 through 810, respectively. For example, the fifth through eighth gate insulating layers 530 through 830 may contact the upper surface of the field insulating layer 105 and the fifth through eighth fin patterns 510 through 810, respectively. Fifth through eighth interfacial layers 531 through 831 may be disposed on the fifth through eighth fin patterns 510 through 810, respectively. The fifth through eighth interfacial layers 531 through 831 may respectively be disposed along the profiles of the fifth through eighth fin patterns 510 through 810 protruding above the upper surface of the field insulating layer 105. Although the fifth through eighth interfacial layers 531 through 831 are illustrated as not being disposed on the upper surface of the field insulating layer 105, embodiments of the inventive concepts are not limited thereto. For example, depending on a method of forming the fifth through eighth interfacial layers 531 through 831, the fifth through eighth interfacial layers 531 through 831 can also be formed along the upper surface of the field insulating layer 105. Fifth through eighth high-k insulating layers 532 through 832 may respectively be disposed on the fifth through eighth interfacial layers 531 through 831 and may respectively be formed along the profiles of the fifth through eighth fin patterns 510 through 810 and the upper surface of the field insulating layer 105.

Fifth through eighth gate electrode structures 520 through 820 may intersect the fifth through eighth fin patterns 510 through 810, respectively. The fifth through eighth gate electrode structures 520 through 820 may extend along the thirteenth through sixteenth directions Y5 through Y8, respectively.

Fifth through eighth source/drain regions 550 through 850 may be disposed in the fifth through eighth fin patterns 510 through 810, respectively.

Figure 13:
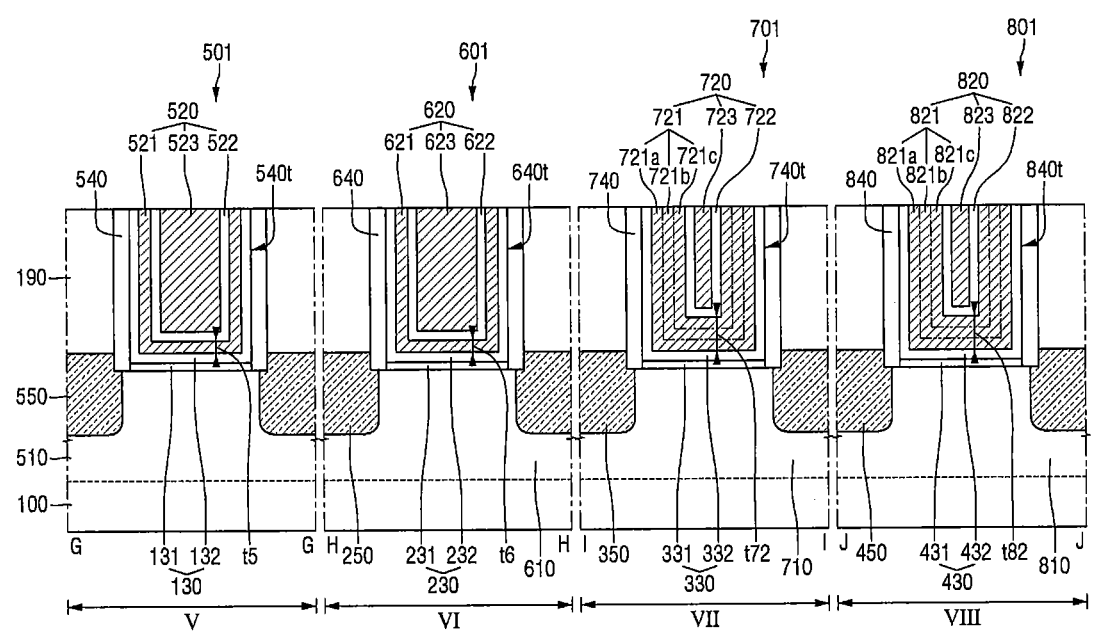
FIG. 13 is a cross-sectional view taken along the lines G-G, H-H, I-I and J-J of FIG. 10.

FIG. 13 is a cross-sectional view taken along the lines G-G, H-H, I-I and J-J of FIG. 10. For ease of description, differences from the semiconductor devices described above with reference to FIGS. 4 and 11 will be mainly described. For reference, FIG. 13 may be substantially similar to FIG. 4 except for fin patterns. Therefore, a description of elements and features identical to those of FIG. 4 will be given briefly or omitted.

Referring to FIG. 13, in a semiconductor device according to the embodiments of the inventive concepts, each of fifth through eighth transistors 501 through 801 may be an n-type fin transistor. The fifth through eighth transistors 501 through 801 may include fifth through eighth fin patterns 510 through 810, respectively. Unlike in FIG. 11, a thickness t72 of a seventh lower TiN layer 721 may be substantially equal to a thickness t82 of an eighth lower TiN layer 821.

Figure 14:
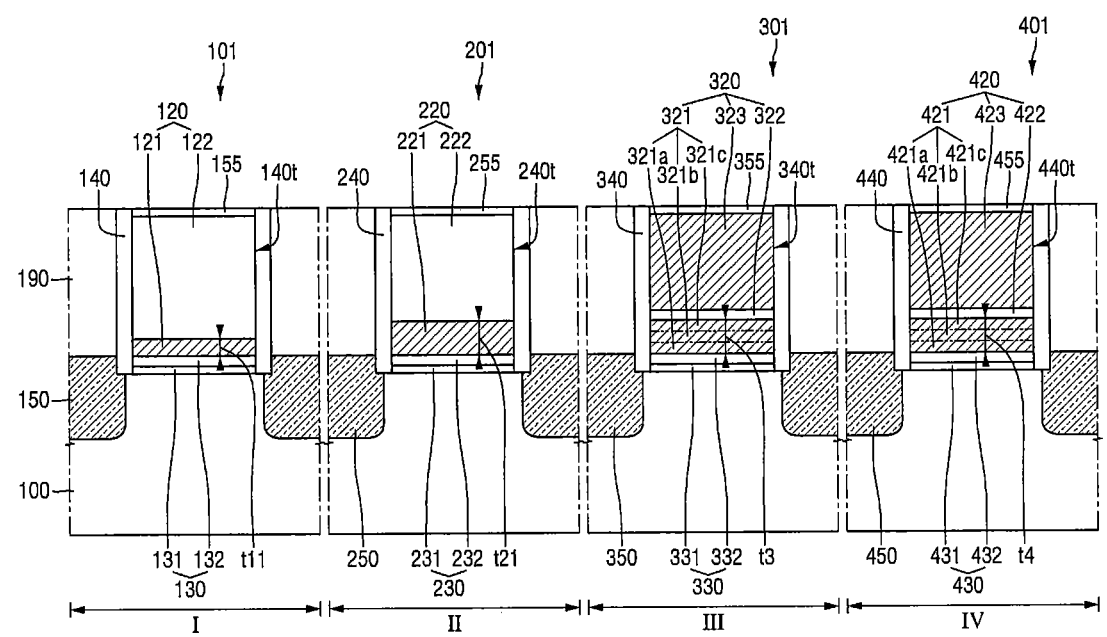
FIGS. 14 through 17 respectively illustrate semiconductor devices according to embodiments of the inventive concepts.

FIG. 14 illustrates a semiconductor device according to embodiments of the inventive concepts. For ease of description, differences from the semiconductor device described above with reference to FIG. 1A will be mainly described.

Referring to FIG. 14, in a semiconductor device according to the embodiments of the inventive concepts, first through fourth high-k insulating layers 132 through 432 may not include portions extending between first through fourth gate electrode structures 120 through 420 and first through fourth gate spacers 140 through 440, respectively. In addition, a first TiN layer 121, a second TiN layer 221, a third lower TiN layer 321, a third upper TiN layer 323, a fourth lower TiN layer 421, a fourth upper TiN layer 423 and first through fourth gate electrodes 122 through 422 respectively in the first through fourth gate electrode structures 120 through 420 may not include portions extending along inner walls of the first through fourth gate spacers 140 through 440, respectively.

As in FIG. 1A, a thickness t11 of the first TiN layer 121 of the embodiment illustrated in FIG. 14 may be smaller than a thickness t21 of the second TiN layer 221.

The embodiment of FIG. 14 also includes a first gate hard mask 155, a second gate hard mask 255, a third gate hard mask 355, and a fourth gate hard mask 455 (referred to herein as first through fourth gate hard masks 155 through 455). Although first through fourth gate hard masks 155 through 455 are illustrated as being respectively formed on the first through fourth gate electrode structures 120 through 420 in FIG. 11, embodiments of the inventive concepts are not limited thereto.

Figure 15:
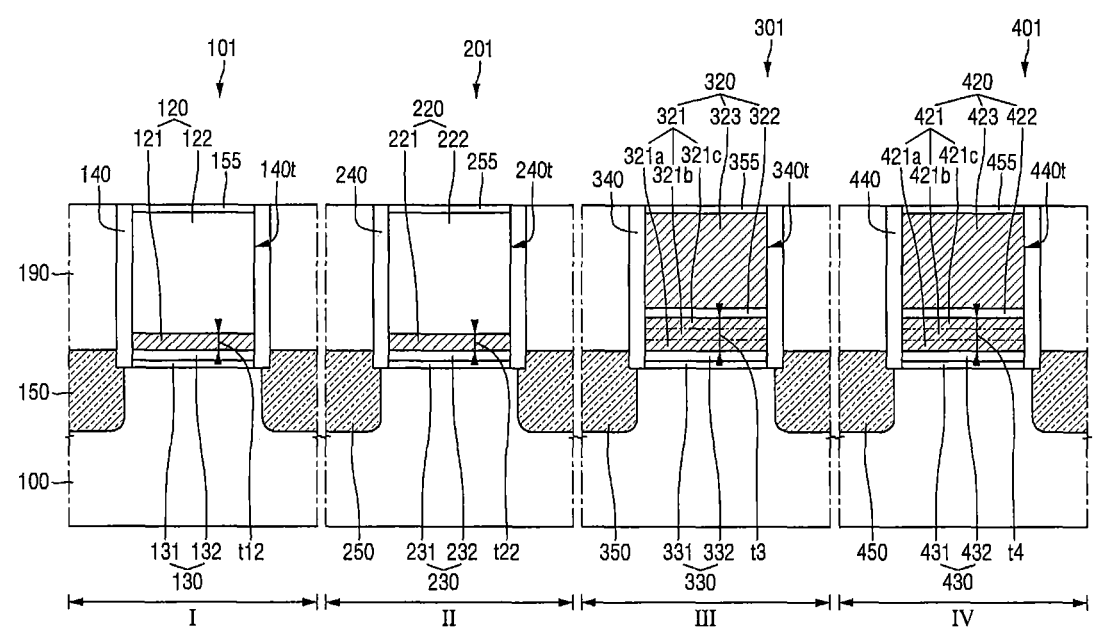

FIG. 15 illustrates a semiconductor device according to embodiments of the inventive concepts. For ease of description, differences from the semiconductor devices described above with reference to FIGS. 2 and 14 will be mainly described. Referring to FIG. 15, a thickness t12 of a first TiN layer 121 may be substantially equal to a thickness t22 of a second TiN layer 221, unlike in FIG. 14.

Figure 16:
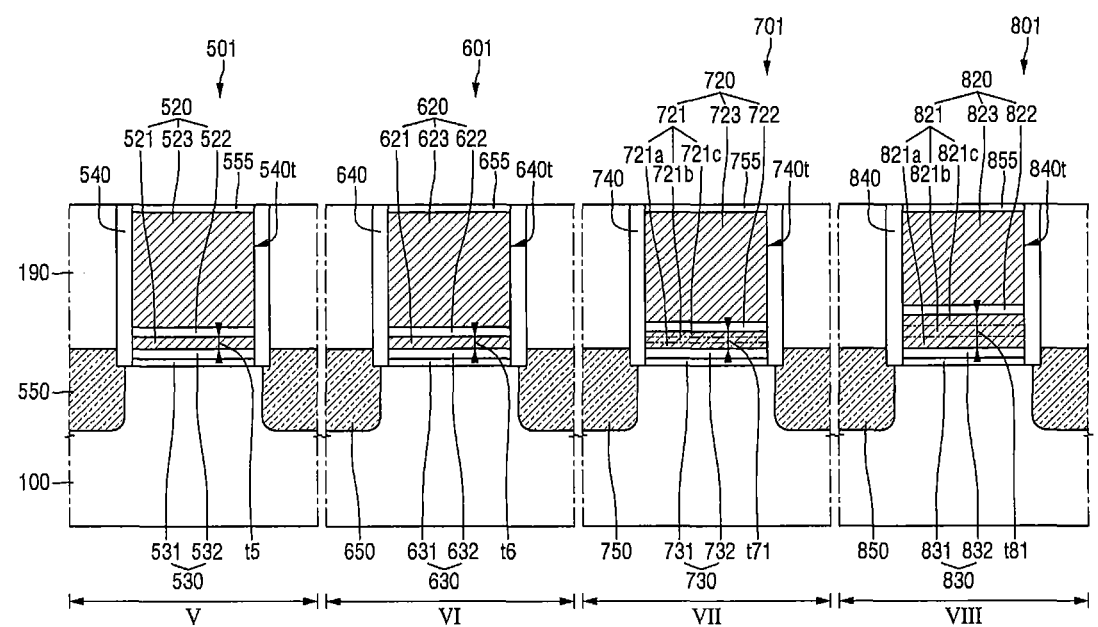

FIG. 16 illustrates a semiconductor device according to embodiments of the inventive concepts. For ease of description, differences from the semiconductor devices described above with reference to FIG. 3 will be mainly described.

Referring to FIG. 16, in a semiconductor device according to the embodiments of the inventive concepts, fifth through eighth high-k insulating layers 532 through 832 may not include portions extending between fifth through eighth gate electrode structures 520 through 820 and fifth through eighth gate spacers 540 through 840, respectively. In addition, a fifth lower TiN layer 521, a fifth upper TiN layer 523, a sixth lower TiN layer 621, a sixth upper TiN layer 623, a seventh lower TiN layer 721, a seventh upper TiN layer 723, an eighth lower TiN layer 821, an eighth upper TiN layer 823, and fifth through eighth gate electrodes 522 through 822 respectively in the fifth through eighth gate electrode structures 520 through 820 may not include portions extending along inner walls of the fifth through eighth gate spacers 540 through 840, respectively. As in FIG. 3, a thickness t81 of the eighth lower TiN layer 821 may be greater than a thickness t71 of the seventh lower TiN layer 721.

The embodiment of FIG. 16 also includes a fifth gate hard mask 555, a sixth gate hard mask 655, a seventh gate hard mask 755, and an eighth gate hard mask 855 (referred to herein as fifth through eighth gate hard masks 555 through 855). Although fifth through eighth gate hard masks 555 through 855 are illustrated as being respectively formed on the fifth through eighth gate electrode structures 520 through 820 in FIG. 16, embodiments of the inventive concepts are not limited thereto.

Figure 17:
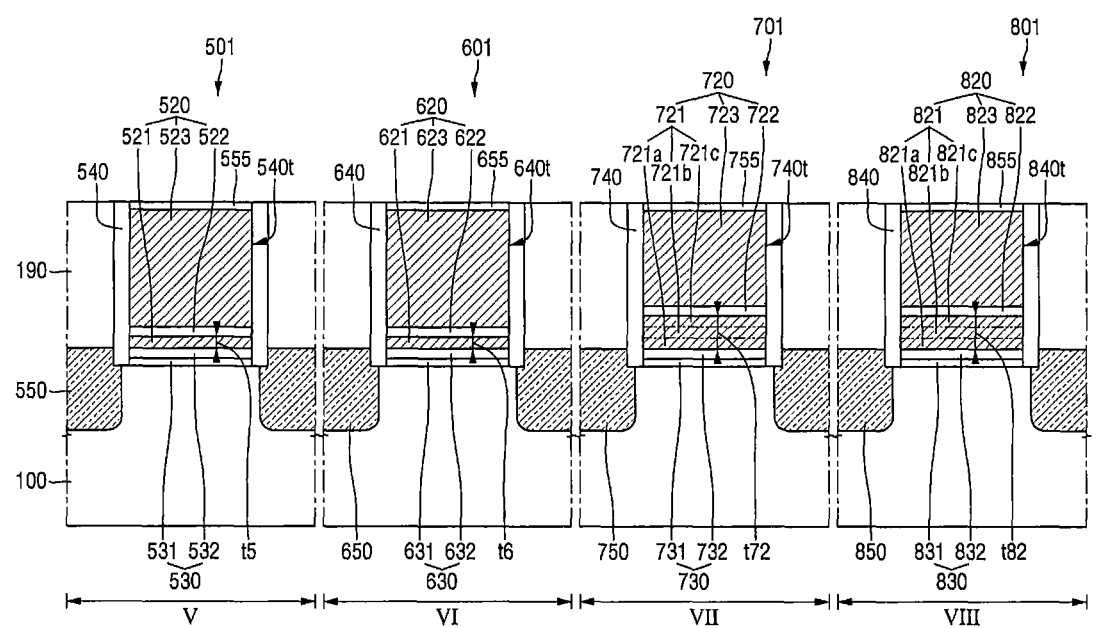

FIG. 17 illustrates a semiconductor device according to embodiments of the inventive concepts. For ease of description, differences from the semiconductor devices described above with reference to FIGS. 4 and 16 will be mainly described. Referring to FIG. 17, a thickness t72 of a seventh lower TiN layer 721 may be substantially equal to a thickness t82 of an eighth lower TiN layer 821, unlike in FIG. 16.

Figure 18:
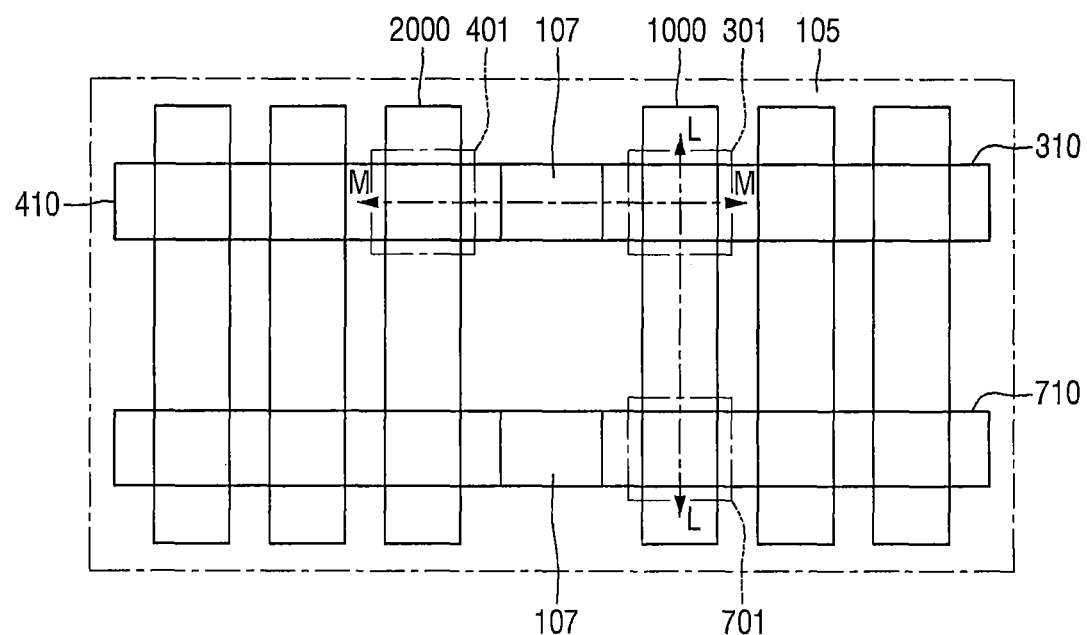
FIG. 18 is a layout view of a semiconductor device according to embodiments of the inventive concepts.
Figure 19:
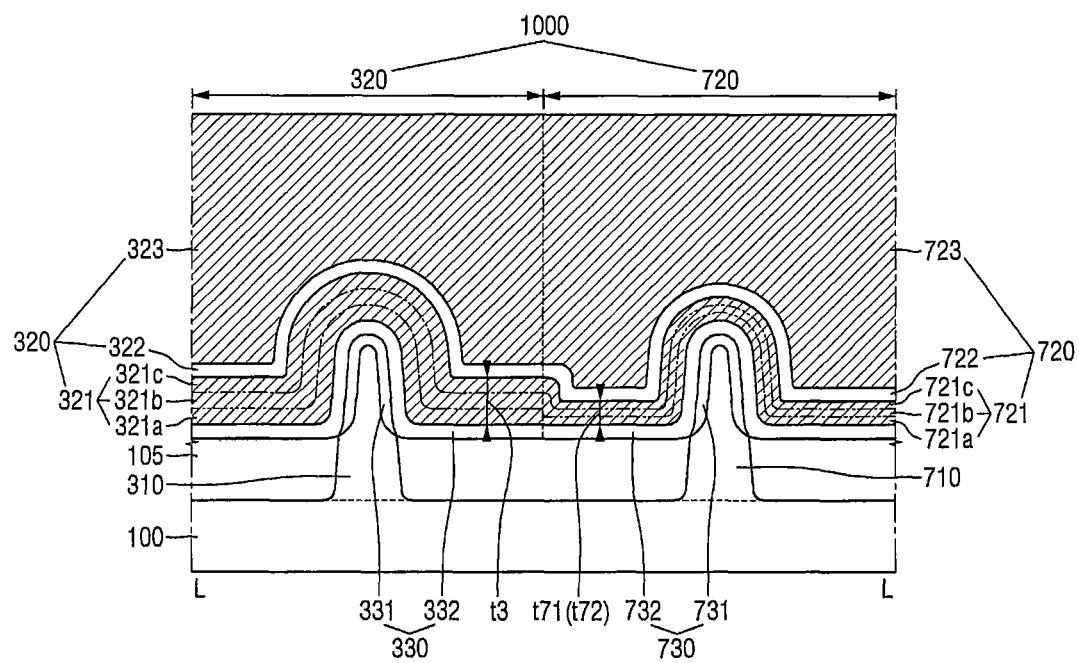
FIG. 19 is a cross-sectional view taken along the line L-L of FIG. 18.
Figure 20:
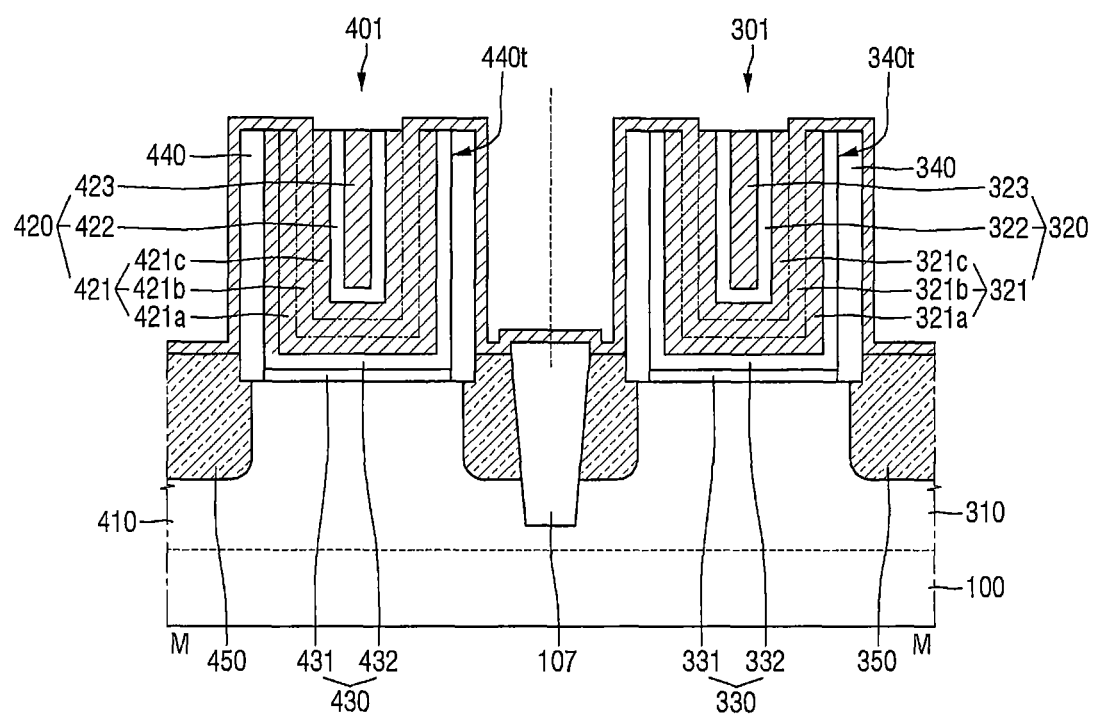
FIG. 20 is a cross-sectional view taken along the line M-M of FIG. 18.

FIG. 18 is a layout view of a semiconductor device according to embodiments of the inventive concepts. FIG. 19 is a cross-sectional view taken along the line L-L of FIG. 18. FIG. 20 is a cross-sectional view taken along the line M-M of FIG. 18.

Referring to FIG. 18, the third fin pattern 310 of FIG. 5 and the seventh fin pattern 710 of FIG. 10 may be spaced apart from each other in a direction with a field insulating layer 105 interposed between them. In addition, the third fin pattern 310 and the fourth fin pattern 410 of FIG. 5 may be spaced apart from each other in another direction with a device isolation layer 107 interposed between them.

A first gate line 1000 may intersect the third fin pattern 310 and the seventh fin pattern 710. The first gate line 1000 may traverse the third fin pattern 310, the field insulating layer 105 and the seventh fin pattern 710. A third transistor 301 may be formed in an area where the first gate line 1000 and the third fin pattern 310 intersect each other. In addition, a seventh transistor 701 may be formed in an area where the first gate line 1000 and the seventh fin pattern 710 intersect each other.

The device isolation layer 107 may be disposed between the third fin pattern 310 and the fourth fin pattern 410 and between the first gate line 1000 and a second gate line 2000.

The second gate line 2000 may intersect the fourth fin pattern 410. A fourth transistor 401 may be formed in an area where the second gate line 2000 and the fourth fin pattern 410 intersect each other.

In the area where the third transistor 301 is formed, the third transistor 301 of FIG. 6 and FIG. 9 may be disposed. In the area where the seventh transistor 701 is formed, any one of the seventh transistor 701 of FIG. 11 and the seventh transistor 701 of FIG. 13 may be disposed. In the area where the fourth transistor 401 is formed, the fourth transistor 401 of FIG. 6 and FIG. 9 may be disposed.

Although only the areas where the third, fourth, and seventh transistors 301, 401, and 701 are formed are illustrated in FIG. 18, embodiments of the inventive concepts are not limited thereto. For example, the first, second, fifth, sixth and eighth areas I, II, V, VI, and VIII described in the preceding figures may be disposed in other areas of a substrate 100.

Referring to FIG. 19, the first gate line 1000 may include a third gate electrode structure 320 and a seventh gate electrode structure 720. In some embodiments, a second portion 321b and an eighth portion 721b may directly contact each other. In other words, the second portion 321b and the eighth portion 721b may be connected to each other. A first portion 321a and a seventh portion 721a may be connected to each other and may be patterned. A third portion 321c and a ninth portion 721c may be connected to each other and may be patterned. A third gate electrode 322 and a seventh gate electrode 722 may be connected to each other and may be patterned. A third upper TiN layer 323 and a seventh upper TiN layer 723 may be connected to each other and may be patterned.

When the semiconductor device according to the embodiments is an SRAM, the third transistor 301 may be a pull-up transistor, and the seventh transistor 701 may be a pull-down transistor.

Referring to FIG. 20, the second portion 321b and a fifth portion 421b may directly contact each other. In other words, the second portion 321b and the fifth portion 421b may be connected to each other. Unlike in FIGS. 6 and 9, the second portion 321b may further extend along an upper surface of the first portion 321a, an upper surface of a third high-k insulating layer 332, upper surfaces of third gate spacers 340, side surfaces of the third gate spacers 340, upper surfaces of third source/drain regions 350, and a portion of an upper surface of the device isolation layer 107.

Unlike in FIGS. 6 and 9, the fifth portion 421b may further extend along an upper surface of a fourth portion 421a, an upper surface of a fourth high-k insulating layer 432, upper surfaces of fourth gate spacers 440, side surfaces of the fourth gate spacers 440, upper surfaces of fourth source/drain regions 450, and a portion of the upper surface of the device isolation layer 107.

The second portion 321b and the fifth portion 421b may directly contact each other on, e.g., the device isolation layer 107. In some embodiments, the second portion 321b, the fifth portion 421b, and the eighth portion 721b may be connected to each other.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A semiconductor device comprising:
a substrate that comprises a first area and a second area;
a first trench and a second trench in the first area and the second area, respectively; and
a first transistor and a second transistor in the first area and the second area respectively,
wherein the first transistor and the second transistor are p-channel metal oxide semiconductor (PMOS) devices,
wherein the first transistor comprises a first gate insulating layer that is on the substrate, a first titanium nitride (TiN) layer that is on the first gate insulating layer, and a first gate electrode that is on the first TiN layer,
wherein the second transistor comprises a second gate insulating layer that is on the substrate, a second TiN layer that is on the second gate insulating layer, and a second gate electrode that is on the second TiN layer,
wherein the first and second TiN layers are respective single layers,
wherein the first gate insulating layer, the first TiN layer, and the first gate electrode are within the first trench,
wherein the second gate insulating layer, the second TiN layer, and the second gate electrode are within the second trench, and
wherein a thickness of the first TiN layer below the first gate electrode and in a vertical direction is smaller than a thickness of the second TiN layer below the second gate electrode and in the vertical direction.

2. The semiconductor device of claim 1, wherein a first threshold voltage of the first transistor is smaller than a second threshold voltage of the second transistor.

3. The semiconductor device of claim 1, wherein the first and second gate insulating layers do not comprise a lanthanum-based material.

4. The semiconductor device of claim 1, wherein the first and the second gate electrodes comprise a same material, and wherein the first gate electrode contacts the first TiN layer and the second gate electrode contacts the second TiN layer.

5. The semiconductor device of claim 1, wherein the substrate further comprises a third area,
wherein the semiconductor device further comprises a third transistor in the third area that is a PMOS device,
wherein the third transistor comprises a third gate insulating layer that is on the substrate, a third lower TiN layer that is on the third gate insulating layer, a third gate electrode that is on the third lower TiN layer, and a third upper TiN layer that is on the third gate electrode, and
wherein a third threshold voltage of the third transistor is greater than a second threshold voltage of the second transistor.

6. The semiconductor device of claim 5, wherein the first and second gate electrodes comprise a same first material, and
wherein the third gate electrode comprises a third metal that is different from the first material.

7. The semiconductor device of claim 5, wherein the substrate further comprises a fourth area,
wherein the semiconductor device further comprises a fourth transistor in the fourth area that is a PMOS device,
wherein the fourth transistor comprises a fourth gate insulating layer that is on the substrate, a fourth lower TiN layer that is on the fourth gate insulating layer, a fourth gate electrode that is on the fourth lower TiN layer, and a fourth upper TiN layer that is on the fourth gate electrode, and
wherein a fourth threshold voltage of the fourth transistor is greater than the third threshold voltage of the third transistor.

8. The semiconductor device of claim 7, wherein a thickness of the third lower TiN layer is substantially equal to a thickness of the fourth lower TiN layer.

9. The semiconductor device of claim 7, wherein the first, second, and third gate insulating layers do not comprise a lanthanum-based material, and
wherein the fourth gate insulating layer comprises the lanthanum-based material.

10. The semiconductor device of claim 7, wherein the third and fourth gate electrodes comprise TiAl, TiAlC, TiAlN, and/or TiAlCN.

11. A semiconductor device comprising:
a substrate comprising a first area and a second area;
a first trench in the first area and a second trench in the second area; and
a first transistor in the first area and a second transistor in the second area,
wherein the first transistor and the second transistor are p-channel metal oxide semiconductor (PMOS) devices,
wherein the first transistor comprises a first gate insulating layer on the substrate and a first gate electrode structure on the first gate insulating layer,
wherein the first gate electrode structure comprises a first barrier layer comprising titanium nitride (TiN) on the first gate insulating layer,
wherein the second transistor comprises a second gate insulating layer on the substrate and a second gate electrode structure on the second gate insulating layer,
wherein the second gate electrode structure comprises a second barrier layer comprising TiN on the second gate insulating layer,
wherein the first and second barrier layers are respective single layers,
wherein the first gate insulating layer and the first gate electrode structure are within the first trench,
wherein the second gate insulating layer and the second gate electrode structure are within the second trench,
wherein the first barrier layer includes a first base portion extending in a first direction and at least one protruding portion protruding from the first base portion in a second direction, the second direction being perpendicular to the first direction,
wherein the second barrier layer includes a second base portion extending in the first direction and at least one protruding portion protruding from the second base portion in the second direction, and
wherein a thickness of the at least one protruding portion of the first barrier layer in the first direction is smaller than a thickness of the at least one protruding portion of the second barrier layer in the first direction.

12. The semiconductor device of claim 11, wherein a first threshold voltage of the first transistor is smaller than a second threshold voltage of the second transistor.

13. The semiconductor device of claim 11, wherein the first gate electrode structure comprises a first gate electrode comprising W that is directly on the first barrier layer,
wherein the second gate electrode structure comprises a second gate electrode comprising W that is directly on the second barrier layer, and
wherein the first and the second gate electrodes comprise a same material.

14. The semiconductor device of claim 11, wherein the substrate further comprises a third area,
wherein the semiconductor device further comprises a third transistor in the third area,
wherein the third transistor is a PMOS device,
wherein the third transistor comprises a third gate insulating layer on the substrate and a third gate electrode structure on the third gate insulating layer,
wherein the third gate electrode structure comprises a third barrier layer comprising TiN on the third gate insulating layer, and
wherein a third threshold voltage of the third transistor is greater than a second threshold voltage of the second transistor.

15. The semiconductor device of claim 14, wherein the first gate electrode structure comprises a first gate electrode comprising W that is directly on the first barrier layer,
wherein the second gate electrode structure comprises a second gate electrode comprising W that is directly on the second barrier layer,
wherein the third gate electrode structure comprises a third gate electrode on the second barrier layer,
wherein the first and second gate electrode comprise a same first material, and
wherein the third gate electrode comprises a third metal that is different from the first material.

16. The semiconductor device of claim 14, wherein the substrate further comprises a fourth area,
wherein the semiconductor device further comprises a fourth transistor in the fourth area that is a PMOS device,
wherein the fourth transistor comprises a fourth gate insulating layer on the substrate and a fourth gate electrode structure on the fourth gate insulating layer,
wherein the fourth gate electrode structure comprises a fourth barrier layer comprising TiN that is on the fourth gate insulating layer, and
wherein a fourth threshold voltage of the fourth transistor is greater than the third threshold voltage of the third transistor.

17. The semiconductor device of claim 16, wherein a thickness of the third barrier layer and a thickness of the fourth barrier layer are substantially equal.

18. The semiconductor device of claim 16, wherein the first, second, and third gate insulating layer do not comprise a lanthanum-based material, and
wherein the fourth gate insulating layer comprises the lanthanum-based material.

19. The semiconductor device of claim 16, wherein the third gate electrode structure comprises a third gate electrode on the second barrier layer,
wherein the fourth gate electrode structure comprises a fourth gate electrode on the second barrier layer, and
wherein the third and fourth gate electrodes comprise TiAl, TiAlC, TiAlN, and/or TiAlCN.

20. A semiconductor device comprising:
a substrate comprising a first area, a second area, a third area, and a fourth area;
a first trench in the first area, a second trench in the second area, a third trench in the third area, and a fourth trench in the fourth area; and
a first transistor in the first area, a second transistor in the second area, a third transistor in the third area, and a fourth transistor in the fourth area,
wherein the first transistor, the second transistor, the third transistor, and the fourth transistor are p-channel metal oxide semiconductor (PMOS) devices,
wherein the first transistor comprises a first gate insulating layer that is on the substrate, a first titanium nitride (TiN) layer that is on the first gate insulating layer, and a first gate electrode that is on the first TiN layer,
wherein the second transistor comprises a second gate insulating layer that is on the substrate, a second TiN layer that is on the second gate insulating layer, and a second gate electrode that is on the second TiN layer,
wherein the third transistor comprises a third gate insulating layer that is on the substrate, a third TiN layer that is on the third gate insulating layer, and a third gate electrode that is on the third TiN layer,
wherein the fourth transistor comprises a fourth gate insulating layer that is on the substrate, a fourth TiN layer that is on the fourth gate insulating layer, and a fourth gate electrode that is on the fourth TiN layer,
wherein the first, second, and third gate insulating layers do not comprise a lanthanum-based material, and
wherein the fourth gate insulating layer comprises the lanthanum-based material.

* * * * *